(12) United States Patent
Jeon et al.

(10) Patent No.: US 9,761,614 B2
(45) Date of Patent: Sep. 12, 2017

(54) THIN FILM TRANSISTOR ARRAY PANEL AND MANUFACTURING METHOD THEREOF

(71) Applicant: SAMSUNG DISPLAY CO., LTD., Yongin, Gyeonggi-Do (KR)

(72) Inventors: Young Jae Jeon, Daejeon (KR); Jae-Hyun Park, Gyeonggi-do (KR)

(73) Assignee: SAMSUNG DISPLAY CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/596,780

(22) Filed: Jan. 14, 2015

(65) Prior Publication Data

US 2016/0035750 A1    Feb. 4, 2016

(30) Foreign Application Priority Data

Jul. 29, 2014    (KR) .................... 10-2014-0096607

(51) Int. Cl.
| | |
|---|---|
| *H01L 29/04* | (2006.01) |
| *H01L 27/12* | (2006.01) |
| *G02F 1/1343* | (2006.01) |
| *G02F 1/1362* | (2006.01) |
| *H01L 29/66* | (2006.01) |

(52) U.S. Cl.
CPC ...... *H01L 27/124* (2013.01); *G02F 1/134363* (2013.01); *G02F 1/136227* (2013.01); *H01L 27/1248* (2013.01); *H01L 27/1288* (2013.01); *H01L 27/1225* (2013.01); *H01L 29/66969* (2013.01)

(58) Field of Classification Search
CPC ............... H01L 27/124; H01L 27/1248; H01L 27/1288; G02F 1/134363; G02F 1/136227
USPC ........................................ 257/59, 72
See application file for complete search history.

(56) References Cited

U.S. PATENT DOCUMENTS

| | | | |
|---|---|---|---|
| 7,602,463 B2 | 10/2009 | Tsuchiya et al. | |
| 8,351,007 B2 | 1/2013 | Kanaya et al. | |
| 8,379,177 B2 | 2/2013 | Jung et al. | |
| 2006/0278877 A1* | 12/2006 | Kim ............... | H01L 29/78633 257/72 |
| 2007/0171319 A1 | 7/2007 | Fujita et al. | |

(Continued)

FOREIGN PATENT DOCUMENTS

| | | |
|---|---|---|
| JP | 5148819 | 12/2012 |
| KR | 1020050069105 | 7/2005 |
| KR | 1020060001165 | 1/2006 |

*Primary Examiner* — Ori Nadav
(74) *Attorney, Agent, or Firm* — F. Chau & Associates, LLC

(57) ABSTRACT

A thin film transistor array panel is provided. A thin film transistor is positioned on a substrate. A first passivation layer is positioned on the thin film transistor. A common electrode is positioned on the first passivation layer. A second passivation layer positioned on the common electrode. A pixel electrode is positioned on the second passivation layer. The pixel electrode is coupled to the thin film transistor through a first contact hole penetrating the first passivation layer, the common electrode, and the second passivation layer. A first part of the first contact hole formed in the common electrode is larger than a second part of the first contact hole formed in the second passivation layer.

8 Claims, 57 Drawing Sheets

(56) References Cited

U.S. PATENT DOCUMENTS

| | | | |
|---|---|---|---|
| 2009/0268134 A1* | 10/2009 | Lee | G02F 1/136286 |
| | | | 349/110 |
| 2012/0086009 A1 | 4/2012 | Shin et al. | |
| 2012/0105416 A1* | 5/2012 | Um | G02F 1/13624 |
| | | | 345/211 |
| 2012/0280237 A1 | 11/2012 | Kwack et al. | |
| 2012/0315715 A1 | 12/2012 | Cho et al. | |
| 2013/0087794 A1 | 4/2013 | Kwack | |

* cited by examiner

THIN FILM TRANSISTOR ARRAY PANEL AND MANUFACTURING METHOD THEREOF

CROSS-REFERENCE TO RELATED APPLICATION

This application claims priority under 35 U.S.C. §119 to Korean Patent Application No. 10-2014-0096607, filed on Jul. 29, 2014 in the Korean Intellectual Property Office, the disclosure of which is incorporated by reference herein in its entirety.

TECHNICAL FIELD

The present invention relates to a thin film transistor array panel and a manufacturing method thereof.

DISCUSSION OF RELATED ART

Liquid crystal displays (LCDs) display an image by aligning liquid crystal molecules of a liquid crystal layer by applying an electric field thereto to adjust an amount of transmitted light through the liquid crystal layer.

Two field generating electrodes are formed on a display panel using different optical masks. The greater the number of optical masks used in a manufacturing process, the more expensive the manufacturing process.

SUMMARY

According to an exemplary embodiment of the present invention, a thin film transistor array panel is provided. A thin film transistor is positioned on a substrate. A first passivation layer is positioned on the thin film transistor. A common electrode is positioned on the first passivation layer. A second passivation layer positioned on the common electrode. A pixel electrode is positioned on the second passivation layer. The pixel electrode is coupled to the thin film transistor through a first contact hole penetrating the first passivation layer, the common electrode, and the second passivation layer. A first part of the first contact hole formed in the common electrode is larger than a second part of the first contact hole formed in the second passivation layer.

According to an exemplary embodiment of the present invention, a manufacturing method of a thin film transistor array panel is provided. A thin film transistor including a gate insulating layer is formed on a substrate. A first passivation layer is formed on the thin film transistor. A common electrode is formed on the first passivation layer. A second passivation layer is formed on the common electrode. A first contact hole is formed by etching the common electrode, the first passivation layer and the second passivation layer. The first contact hole exposes the thin film transistor. A pixel electrode is formed in the first contact hole. The pixel electrode is coupled to the thin film transistor. The forming of the first contact hole includes over-etching the common electrode so that a first empty space is formed under the second passivation layer. The pixel electrode covers the first empty space without filling the first empty space.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
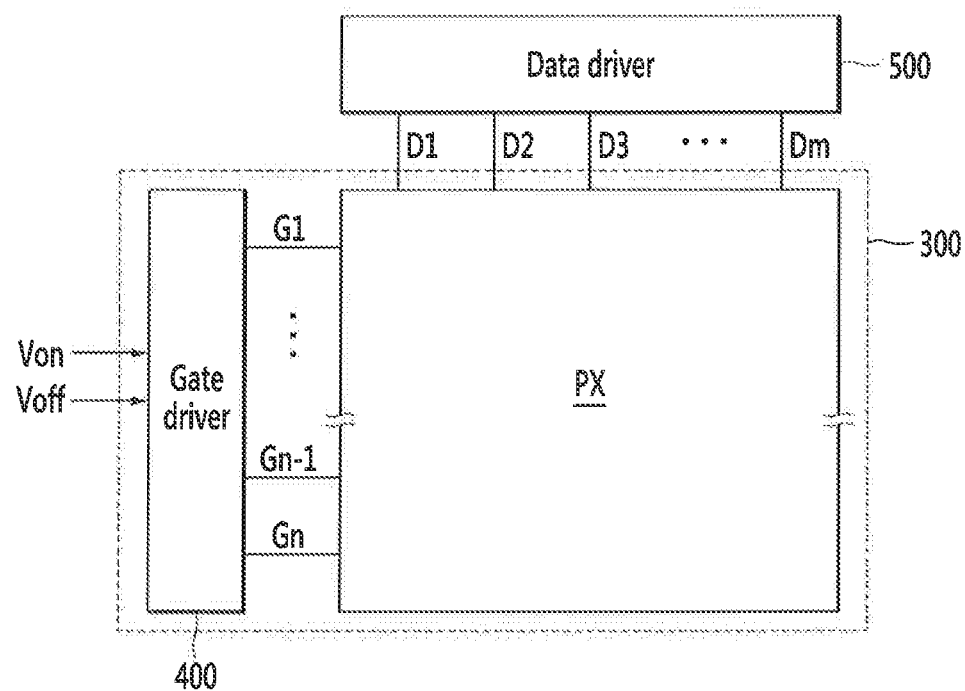
FIG. 1 is a block diagram of a thin film transistor array panel according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

First, referring to FIG. 1, a thin film transistor array panel according to an exemplary embodiment of the present invention will be described.

FIG. 1 is a block diagram of the thin film transistor array panel according to an exemplary embodiment of the present invention.

As shown in FIG. 1, a display device includes a display panel assembly 300 including a pixel area PX and a gate driver 400 coupled thereto, and a data driver 500 coupled to the pixel area PX.

In addition, the display device includes a gray voltage generator (not shown) coupled to the data driver 500, and a signal controller (not shown) for controlling the gate driver 400, the data driver 500, and the gray voltage generator.

The gate driver 400 may be simultaneously formed with the display panel assembly 300 in a manufacturing process. For example, the gate driver 400 may be integrally formed at one lateral side of the display area PX such that it may be covered by a black matrix.

The pixel area PX includes a plurality of signal lines G1 to Gn and D1 to Dm, and a plurality of pixels coupled thereto.

The display signal lines G1 to Gn and D1 to Dm include a plurality of gate lines G1 to Gn for transmitting a gate signal (referred to as a scanning signal) and a plurality of data lines D1 to Dm for transmitting a data signal.

The gate lines G1 to Gn extend in a row direction and are in substantially parallel with each other, and the data lines D1 to Dm extend in a column direction and are in substantially parallel with each other.

The thin film transistor array panel according to an exemplary embodiment of the present invention will now be described with reference to FIGS. 2 to 7.

Figure 2:
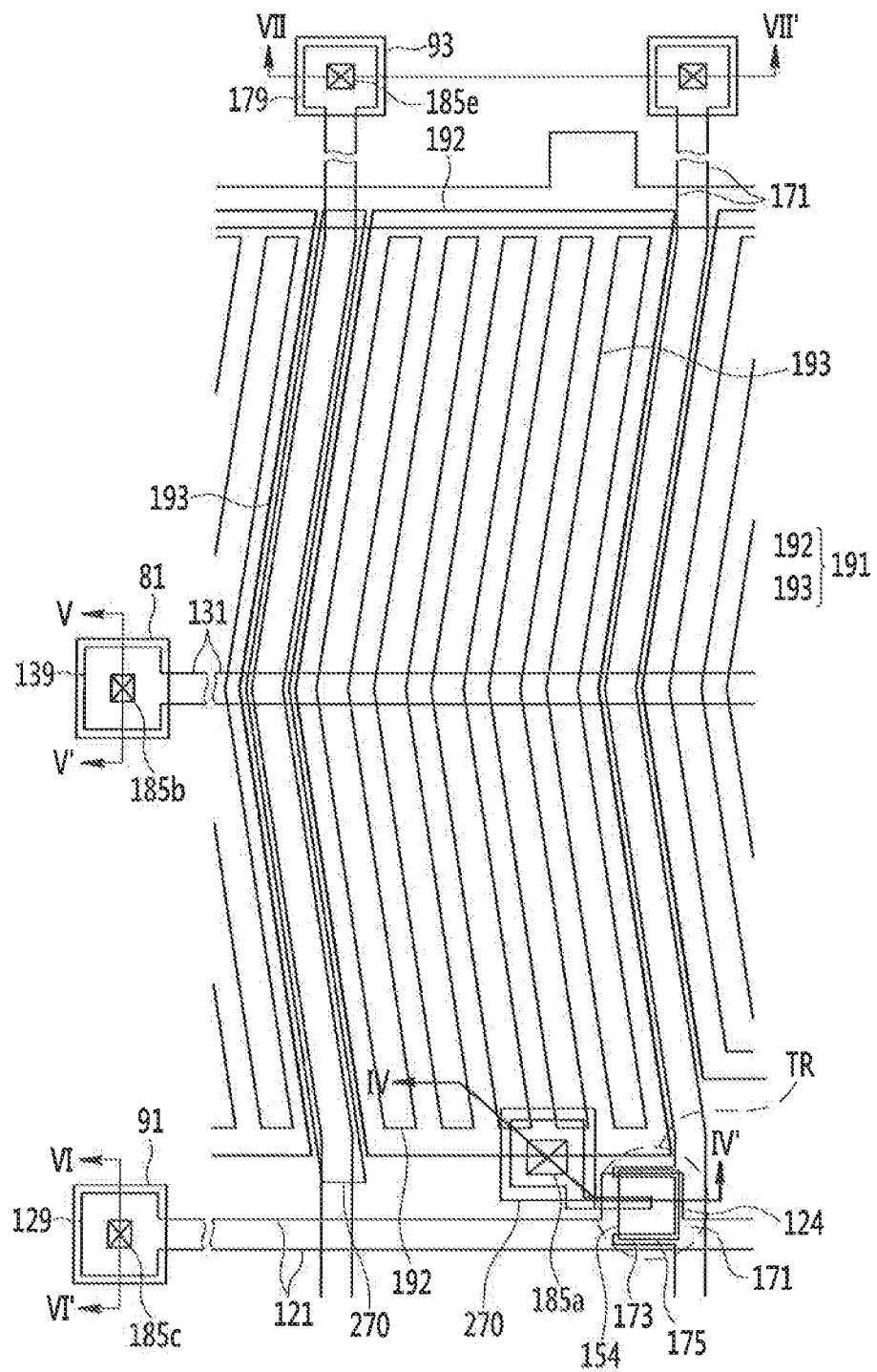
FIG. 2 is a top plan view of one pixel of the thin film transistor according to an exemplary embodiment of the present invention.
Figure 3:
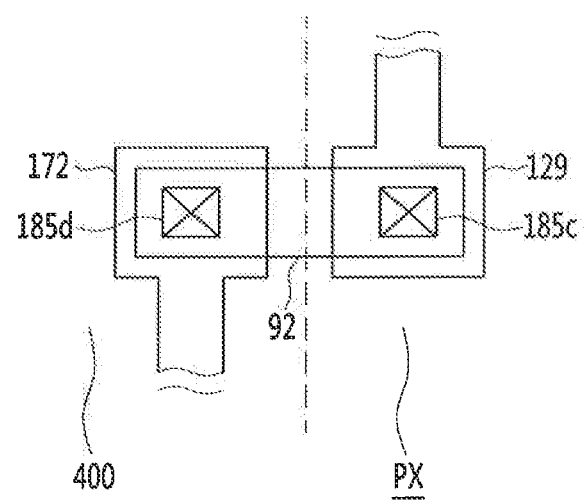
FIG. 3 is a partial top plan view of a gate pad portion and a signal line region according to an exemplary embodiment of the present invention.
Figure 4:
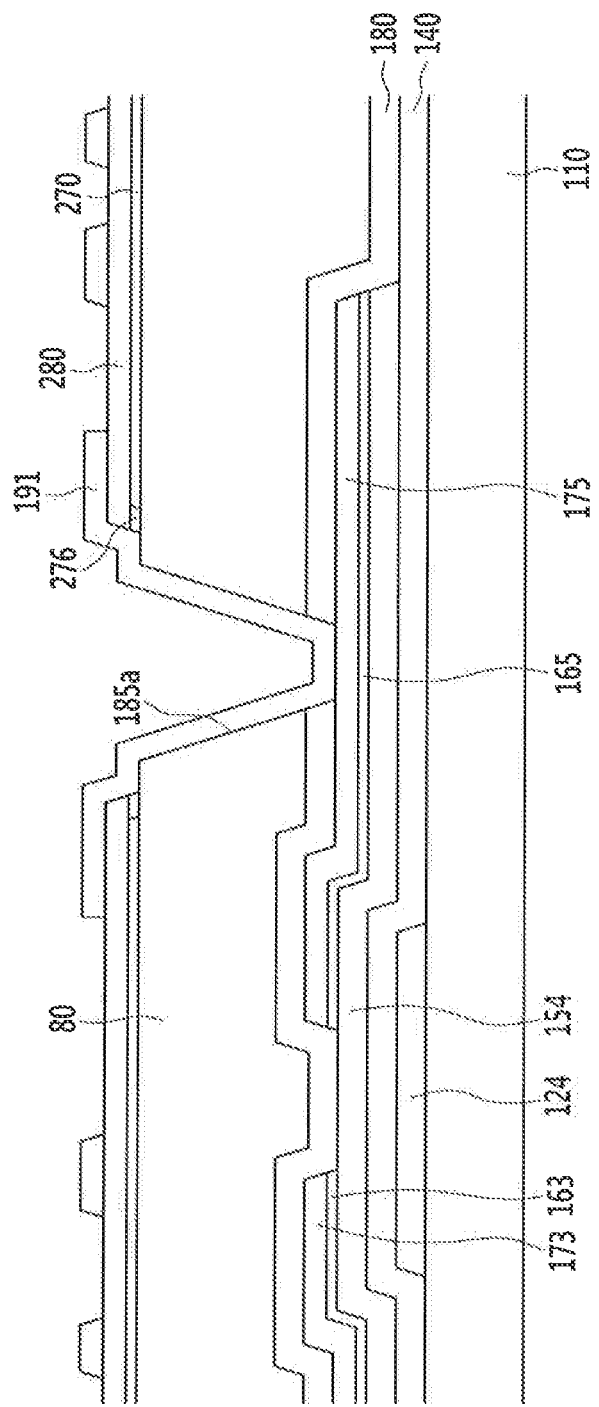
FIG. 4 is a cross-sectional view of FIG. 2 taken along line IV-IV'.
Figure 5:
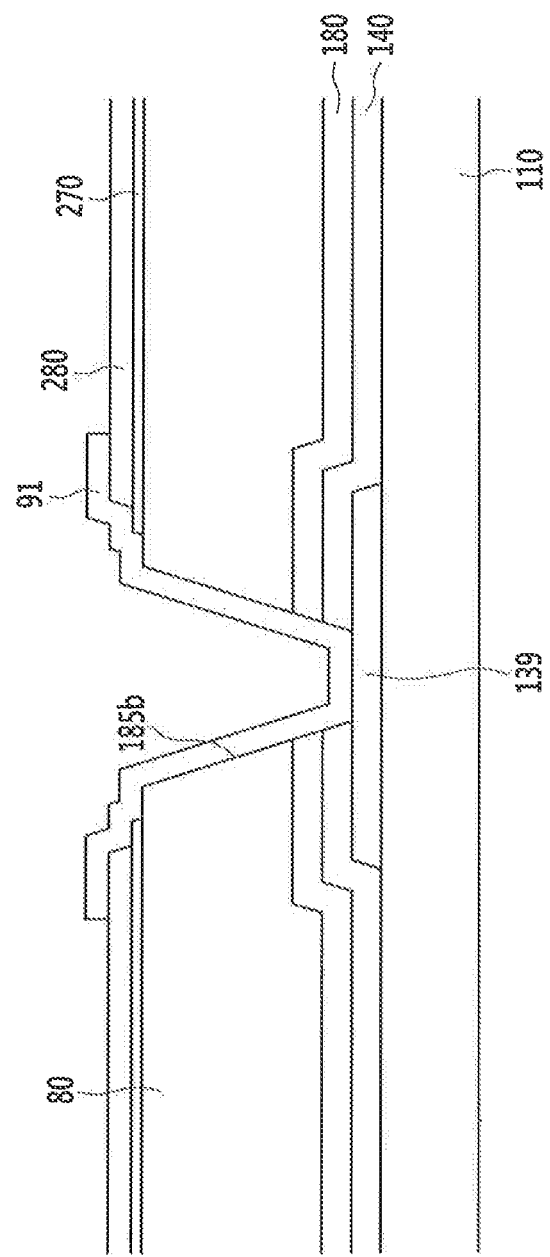
FIG. 5 is a cross-sectional view of FIG. 2 taken along line V-V'.
Figure 6:
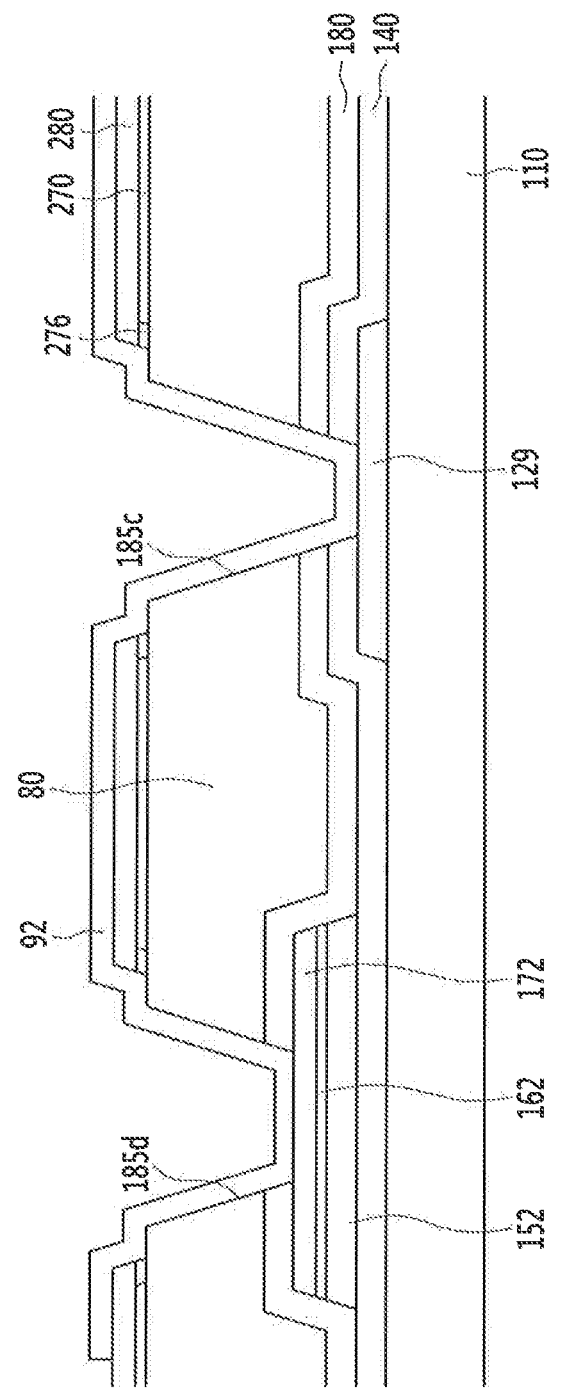
FIG. 6 is a cross-sectional view of FIG. 2 taken along line VI-VI'.
Figure 7:
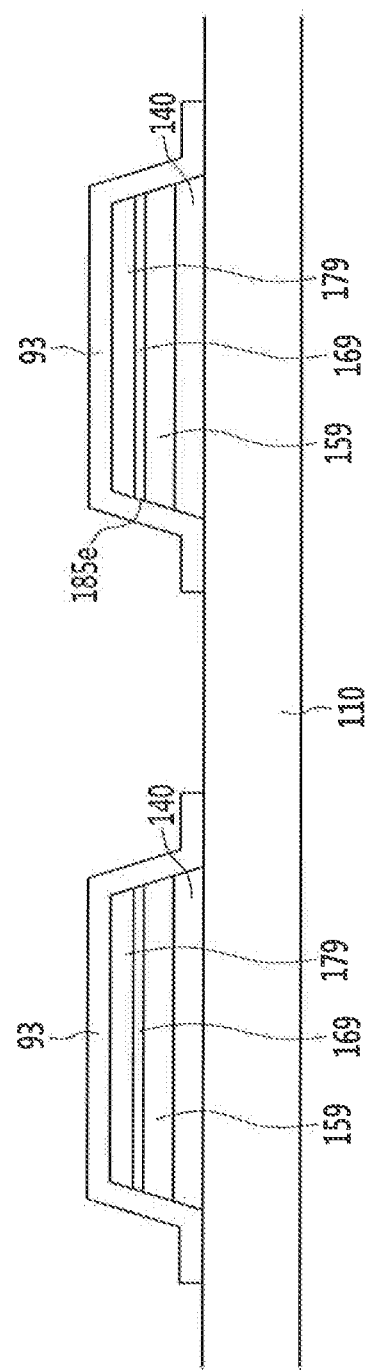
FIG. 7 is a cross-sectional view of FIG. 2 taken along line VII-VII'.

FIG. 2 is a top plan view of one pixel according to an exemplary embodiment of the present invention, FIG. 3 is a partial top plan view of a gate pad portion and a signal line region according to an exemplary embodiment of the present invention, FIG. 4 is a cross-sectional view of FIG. 2 taken along line IV-IV', FIG. 5 is a cross-sectional view of FIG. 2 taken along line V-V', FIG. 6 is a cross-sectional view of FIG. 2 taken along line VI-VI', and FIG. 7 is a cross-sectional view of FIG. 2 taken along line VII-VI'.

Referring to FIGS. 2 to 7, a plurality of gate lines 121 and a plurality of storage electrode lines 131 are positioned on an insulation substrate 110 that is formed of transparent glass or plastic.

The gate lines 121 transmit the gate signal and extend mainly in a horizontal direction.

Each gate line 121 includes a plurality of protruding gate electrodes 124, and a wide gate pad portion 129 for connection with another layer or an external driving circuit.

The gate line 121 positioned in the pixel area PX may be extended to the gate pad portion 129 that is positioned in the gate driver 400.

The gate driver 400 for generating the gate signal is integrated with the pixel area onto the substrate 110. Alternatively, the gate driver 400 may be mounted on a flexible printed circuit film (not shown) that is attached to the insulation substrate 110.

The storage electrode lines 131, applied with a predetermined voltage, for example, a common voltage, include stem lines extending in substantially parallel with the gate line 121.

Each storage electrode line 131 is positioned between two adjacent gate lines 121, and may be positioned closer to one of the two gate lines 121 or at the center between the two gate lines 121.

Shapes and arrangements of the storage electrode line 131 are not limited to the aforementioned description and may be variously modified.

The storage electrode line 131 includes a storage electrode pad portion 139 that is coupled to a common electrode 270 to be applied with the common voltage.

The overlapped area of the common electrode 270 and a pixel electrode 191 is reduced, and thus the storage electrode line 131 may compensate a reduced capacitance between the common electrode 270 and the pixel electrode.

The gate conductors 121, 124, and 129 may be formed as a single layer or a multilayer including two or more conductive layers. The storage electrode lines 131 and 139 may be formed as a single layer or a multilayer including two or more conductive layers.

For example, the gate conductors 121, 124, and 129 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

The storage electrode lines 131 and 139 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

A gate insulating layer 140 is formed on the gate conductors 121, 124, and 129 and the storage electrode lines 131 and 139.

The gate insulating layer 140 may be formed of an inorganic insulating material such as silicon nitride ($SiN_x$), silicon oxide ($SiO_x$), or the like.

Semiconductor layers 152, 154, and 159 formed of hydrogenated amorphous silicon (a-Si) or polysilicon are formed on the gate insulating layer 140.

Ohmic contacts 162, 163, 165, and 169 are disposed on the semiconductor layers 152, 154, and 159.

The ohmic contacts 162, 163, 165, and 169 may be formed of a material such as n+ hydrogenated amorphous silicon in which an n-type impurity such as phosphor is doped at a high concentration, or of a silicide.

The semiconductor layers 152, 154, and 159 may include an oxide semiconductor, and the ohmic contacts 162, 163, 165, and 169 may be omitted if the semiconductor layers 152, 154, and 159 are oxide semiconductors.

Data conductors 171, 173, 175, and 179 including a source electrode 173, a data line 171 including a data pad portion 179, and a drain electrode 175 are positioned on the ohmic contacts 162, 163, 165, and 169. Part of the data line 171 facing the drain electrode 175 may serve as the source electrode 173, as shown in a transistor region TR of FIG. 2. In addition, a data layer signal line 172 is positioned thereon to be coupled to the gate pad portion 129. The data layer signal line 172 is positioned in the gate driver 400, and the gate pad portion 129 is disposed in the pixel area PX. The data lines 171 transmit the data signal and extend mainly in a vertical direction to cross the gate lines 121.

Each data line 171 includes the source electrode 173 and the wide data pad portion 179. The source electrode 173 partially overlaps the semiconductor layer 154 forming a U-shape, and one end of the data conductor 175 is extended into the U-shape source electrode 173 to form the transistor region TR. The data line 171 is connected through wide data pad portion 179 to another layer or an external driving circuit.

The data driver 500 for generating the data signal may be mounted on a flexible printed circuit film (not shown) that is attached to the insulation substrate 110, or may be mounted directly on the insulation substrate 110.

The drain electrode 175 includes one rod-shaped end portion facing the source electrode 173, and the other end portion having a wide area. The one rod-shaped end portion is extended into the U-shaped source region.

The ohmic contact 169 is disposed under the data pad portion 179, and the ohmic contact 169 may be omitted.

The data conductors 171, 172, 173, 175, and 179 may be formed as a single layer or multilayers including two or more conductive layers. The data layer signal line 172 may be referred to as part of the data conductors 171, 172, 173, 175 and 179.

The data conductors 171, 172, 173, 175, and 179 may be formed of a refractory metal such as chromium (Cr) or an alloy thereof.

Lateral sides of the data conductors 171, 172, 173, 175, and 179 may be inclined at angles of about 30° to 80° with respect to a surface of the insulation substrate 110.

The gate electrode 124, the source electrode 173, and the drain electrode 175 described above form a thin film transistor (TFT) as a switching element along with the semiconductor layer 154.

The semiconductor layer 154 may have substantially the same planar shape as the data conductors 171, 172, 173, 175, and 179 except at the channel region of the thin film transistor.

A first passivation layer 180 is positioned on the gate insulating layer 140, the data conductors 171, 172, 173, 175, and 179, and the exposed semiconductor layer 154, and the first passivation layer 180 may be formed of an organic insulating material or an inorganic insulating material. For example, the inorganic insulating material may include silicon nitride or silicon oxide.

The organic insulating material may have photosensitivity and its dielectric constant may be less than about 4.0.

However, the first passivation layer 180 may have a multilayer structure of a lower inorganic layer and an upper organic layer to have an insulating property of the organic layer without damaging the exposed semiconductor layer 154.

Next, an organic layer 80, the common electrode 270, and a second passivation layer 280 are positioned on the first passivation layer 180.

The present invention is not limited thereto, and a color filter (not shown) is positioned on the first passivation layer 180.

The common electrode 270 may be located further inward than the first passivation layer 180 in its forming process. For example, the common electrode 270 may be located further inward than the first and second passivation layers 180 and 280 around a first contact hole 185a where the pixel electrode 191 and the drain electrode 175 are coupled to each other. The size of the first contact hole 185a positioned in the common electrode 270 is larger than those of first contact holes 185a positioned in the first and second passivation layers 180 and 280.

The common electrode 270 may be formed of a transparent conductive material such as Indium Tin Oxide (ITO) or Indium Zinc Oxide (IZO).

The common electrode 270 is positioned in the display area where a plurality of pixels are positioned to display an image.

The common electrode 270 may be formed to have a planar shape on the entire surface of the insulation substrate 110, and may have an opening that is disposed in a region corresponding to a periphery of the drain electrode 175.

For example, the common electrode 270 may have a plate-like planar shape.

The adjacent common electrodes 270 may be coupled to each other to receive the fixed common voltage that is supplied from outside of the display area.

The second passivation layer 280 is positioned on the common electrode 270 to insulate the pixel electrode 191 therefrom, and the second passivation layer 280 may be formed of an identical or similar material to that of the first passivation layer 180.

Next, the pixel electrode 191, a first contact assistant 91, a second contact assistant 92, and a third contact assistant 93 are positioned in the first contact hole 185a, a second contact hole 185b, third contact holes 185c and 185d, and a fourth contact hole 185e.

The pixel electrode 191, the first contact assistant 91, the second contact assistant 92, and the third contact assistant 93 may be formed of a transparent conductive material such as ITO or IZO.

Further, the thickness of the pixel electrode 191 may exceed about 500 Å, or may be formed to exceed twice the thickness of the common electrode 270. With the pixel electrode having such thickness, the pixel electrode is formed in a manufacturing process without being short-circuited with the common electrode 270 due to an empty space 276. The present invention is not limited thereto, and the thickness range may vary according to the thickness of the empty space 276 so that the pixel electrode 191 does not fill the empty space when formed in a manufacturing process. The manufacturing process will be described later.

The pixel electrode 191 is electrically coupled to the drain electrode 175 through the first contact hole 185a. The pixel electrode 191 receives a data voltage from the drain electrode 175.

The pixel electrode 191 applied with the data voltage generates an electric field applied to a liquid crystal layer (not shown) with the common electrode 270 applied with the common voltage.

The pixel electrode 191 includes a plurality of branch electrodes 193, and upper and lower horizontal portions 192. The branch electrodes 193 are extended in substantially parallel to each other and are separated from each other. The upper and lower horizontal portions 192 connect upper and lower end portions of the branch electrodes 193.

The branch electrodes 193 of the pixel electrode 191 may be bent along the data line 171.

The first contact assistant 91 is in contact with the storage electrode pad portion 139 that is exposed by the second contact hole 185b, and the second contact assistant 92 is in contact with the gate pad portion 129 and the data layer signal line 172 that are exposed by the third contact holes 185c and 185d.

In addition, the third contact assistant 93 is in contact with the data pad portion 179 formed on the insulation substrate 110 and the gate insulating layer 140 through the fourth contact hole 185e.

The respective contact assistants 91, 92, and 93 increase adhesion between the respective pad portions 129, 139, and 179 and a conductive line extended from the gate driver 400 and the data driver 500, and protect them.

Meanwhile, referring to FIG. 4, the common electrode 270 formed in a region where the first contact hole 185a is positioned is over-etched so that the empty space 276 is formed between the second passivation layer 280 and the organic layer 80.

For example, the common electrode 270 of the region where the first contact hole 185a is positioned is located further inward than the first passivation layer 180 and the second passivation layer 280.

Accordingly, the pixel electrode 191 formed in the first contact hole 185a is not in contact with the common electrode 270, because the empty space 276 is interposed between the pixel electrode 191 and the common electrode 270. Similarly, the common electrode 270 formed in a region where the third contact holes 185c and 185d are positioned is also formed further inward than the second and first passivation layers 280 and 180. For example, the common electrode 270 is over-etched further than the first and second passivation layers 180 and 280, thereby forming the third contact holes 185c and 185d of relatively larger sizes.

Accordingly, the second contact assistant 92 formed in the third contact holes 185c and 185d is not in contact with the common electrode, because the empty space is interposed between the contact assistant 92 and the common electrode 270.

As described above, the common electrode 270 may be etched by a wet etching method using an ITO etchant or the like, and for example, an etching time may be increased such that the common electrode 270 is over-etched further than the second and first passivation layers 280 and 180 to be formed inward.

On the contrary, referring to FIG. 5, the common electrode 270 protrudes further than the second passivation layer 280 in a region where the second contact hole 185b is positioned.

For example, the second passivation layer 280 partially exposes the common electrode 270.

Thus, the first contact assistant 91 formed in the second contact hole 185b may couple the storage electrode pad portion 139 with the exposed common electrode 270 to apply the common voltage to the storage electrode line 131.

As shown in FIG. 7, the data pad portion 179 is formed on the insulation substrate 110 and the gate insulating layer 140, and may be coupled to the data driver 500 through the third contact assistant in the fourth contact hole 185e to receive the data signal.

Though not illustrated, an alignment layer is coated on the pixel electrode 191 and the second passivation layer 280, and the alignment layer may be a horizontal alignment layer that is rubbed in a predetermined direction. Alternatively, the alignment layer may include a photoreactive material to be photo-aligned.

A manufacturing method of a thin film transistor array panel according to an exemplary embodiment of the present invention will now be described with reference to FIGS. 8 to 39.

FIGS. 8, 12, 16, 20, 24, 28, 32, and 36 are cross-sectional views of FIG. 2 taken along line IV-IV' according to an exemplary embodiment, FIGS. 9, 13, 17, 21, 25, 29, 33, and 37 are cross-sectional views of FIG. 2 taken along line V-V' according to an exemplary embodiment, FIGS. 10, 14, 18, 22, 26, 30, 34, and 38 are cross-sectional views of FIG. 2 taken along line VI-VI' according to an exemplary embodiment, and FIGS. 11, 15, 19, 23, 27, 31, 35, and 39 are cross-sectional views of FIG. 2 taken along line VII-VII' according to an exemplary embodiment.

First, referring FIGS. 8 to 11, gate conductors 121, 124, and 129 including a gate line 121, a gate electrode 124, and a gate pad portion 129, and a storage electrode line 131 including a storage electrode pad portion 139, are formed on an insulation substrate 110, and a gate insulating layer 140 is laminated thereon.

Next, an amorphous silicon layer 150, an ohmic contact layer 160, and a data conductive layer 170 are laminated on the gate insulating layer 140.

Then, a photosensitive film is laminated on the data conductive layer 170 and is exposed and developed using a halftone mask to form a predetermined photosensitive pattern 800.

Figure 8:
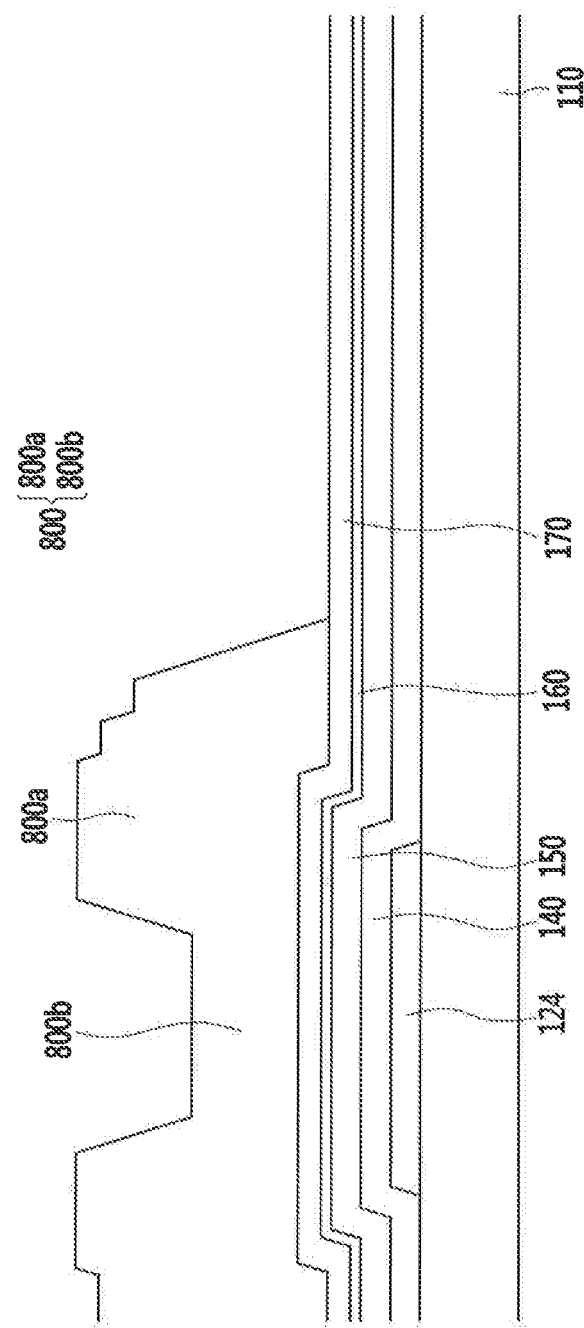
FIGS. 8, 12, 16, 20, 24, 28, 32, and 36 are cross-sectional views of FIG. 2 taken along line IV-IV' according to an exemplary embodiment of the present invention.

Referring to FIG. 8, the photosensitive film pattern 800 includes a first region 800a of a first thickness and a second region 800b of a second thickness which is half the first thickness. The first region 800a is formed in a region where a source electrode 173 and a drain electrode 175 are to be formed, and the second region 800b is formed in a region where an empty space between the source electrode 173 and the drain electrode 175 is to be formed.

Using the photosensitive pattern 800 as a single mask, the source electrode 173, the drain electrode 175, ohmic contacts 163 and 165, and a semiconductor layer 154 are formed.

Figure 9:
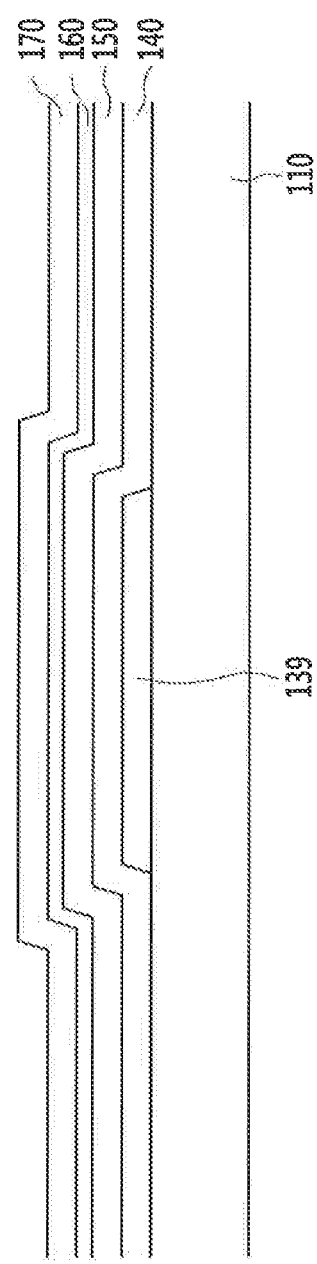
FIGS. 9, 13, 17, 21, 25, 29, 33, and 37 are cross-sectional views of FIG. 2 taken along line V-V' according to an exemplary embodiment of the present invention.
Figure 10:
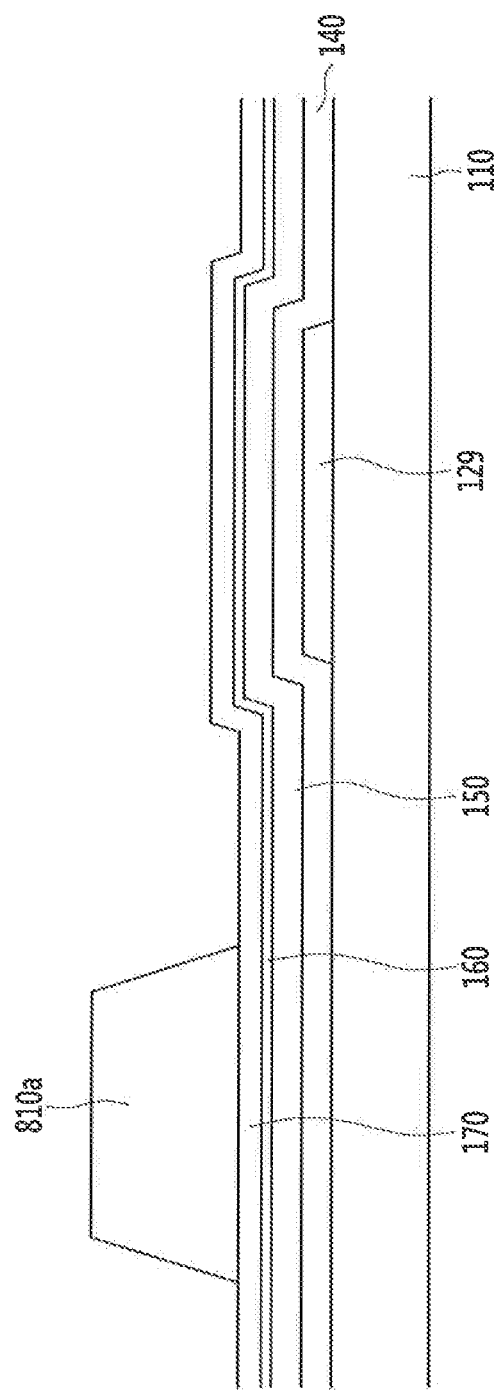
FIGS. 10, 14, 18, 22, 26, 30, 34, and 38 are cross-sectional views of FIG. 2 taken along line VI-VI' according to an exemplary embodiment of the present invention.

Meanwhile, as shown in FIG. 9, no photosensitive pattern is positioned in a region where the storage electrode pad portion 139 is positioned, and the photosensitive pattern 800 of the first thickness is formed in a region where the data layer signal line 172 of FIG. 6 coupled to the gate pad portion 129 is formed, as shown in FIG. 10.

Figure 11:
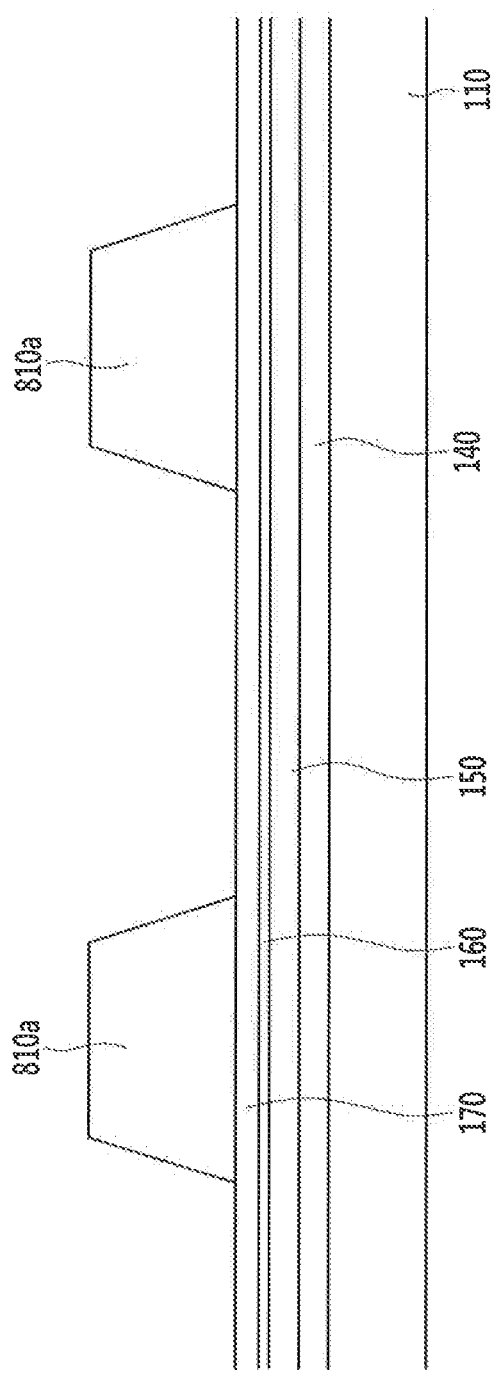
FIGS. 11, 15, 19, 23, 27, 31, 35, and 39 are cross-sectional views of FIG. 2 taken along line VII-VII' according to an exemplary embodiment of the present invention.

Similarly, the photosensitive pattern 800 of the first thickness is also formed in a region on which a data pad portion 179 is to be formed (refer to FIG. 11).

Next, referring to FIGS. 12 to 15, the data conductive layer 170, the ohmic contact layer 160, and the amorphous silicon layer 150 are etched using the photosensitive pattern 800 as a mask.

Figure 12:
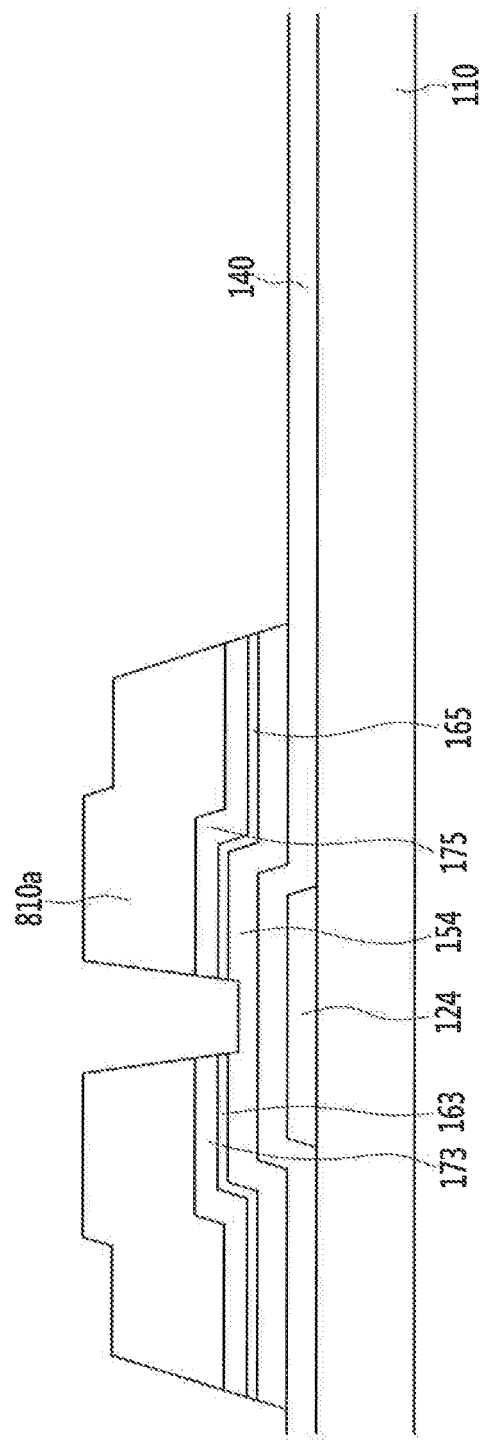

Referring to FIG. 12, the data conductive layer 170 and the ohmic contact layer 160 underneath the second region 800b are removed to expose the amorphous silicon layer 150 in an etching process using the photosensitive pattern 800 as a mask.

The source electrode 173, the drain electrode 175, and the ohmic contacts 162, 163, and 165 that are respectively separated are formed by the etching.

Then, using the remaining second region 800b of the photosensitive pattern 800 as a mask, the amorphous silicon layer 150 is further etched to form the partially exposed semiconductor layer 154.

Figure 13:
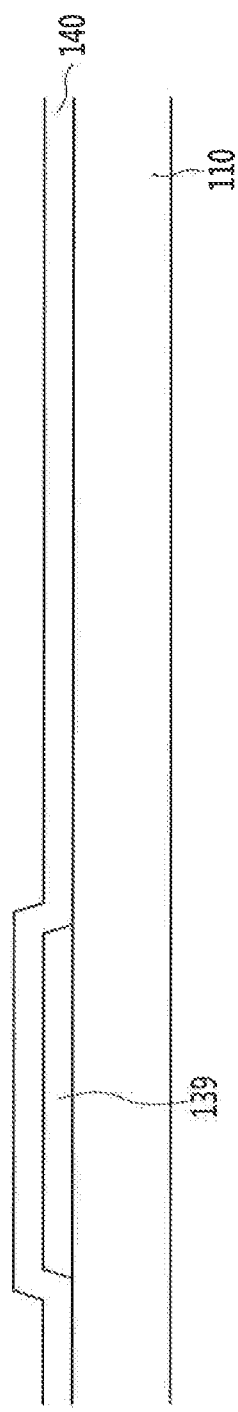

In FIG. 13, the data conductive layer 170, the ohmic contact layer 160, and the amorphous silicon layer 150 excluding the gate insulating layer 140 are etched in the etching process, because no photosensitive pattern 800 is not positioned on the region where the storage electrode pad portion 139 of FIG. 5 is formed.

Figure 14:
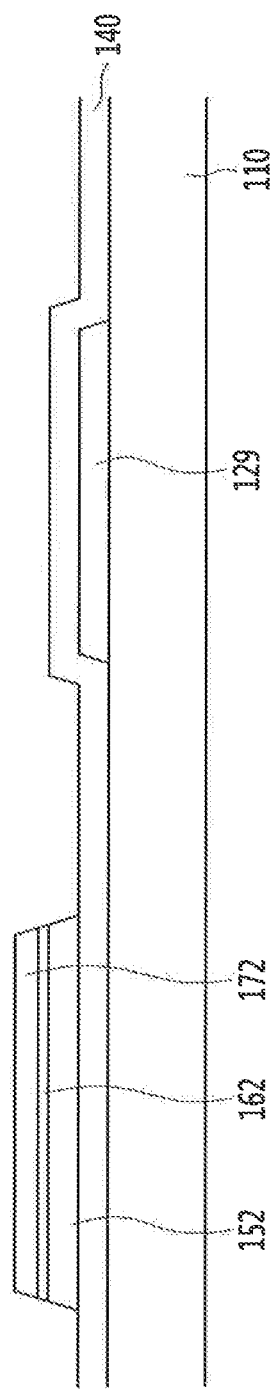

In FIG. 14, since the photosensitive pattern 800 for forming the data layer signal line 172 is positioned in the region where the data layer signal line 172 of FIG. 6 is to be formed, the data conductive layer 170, the ohmic contact layer 160, and the amorphous silicon layer 150, excluding the gate insulating layer 140 and the data layer signal line 172, formed as a triple layer structure of 152, 162, and 172, are removed.

Figure 15:
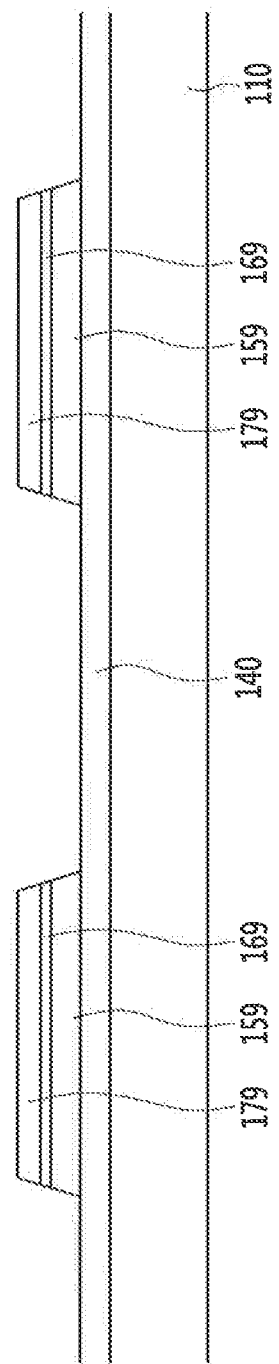
Figure 16:
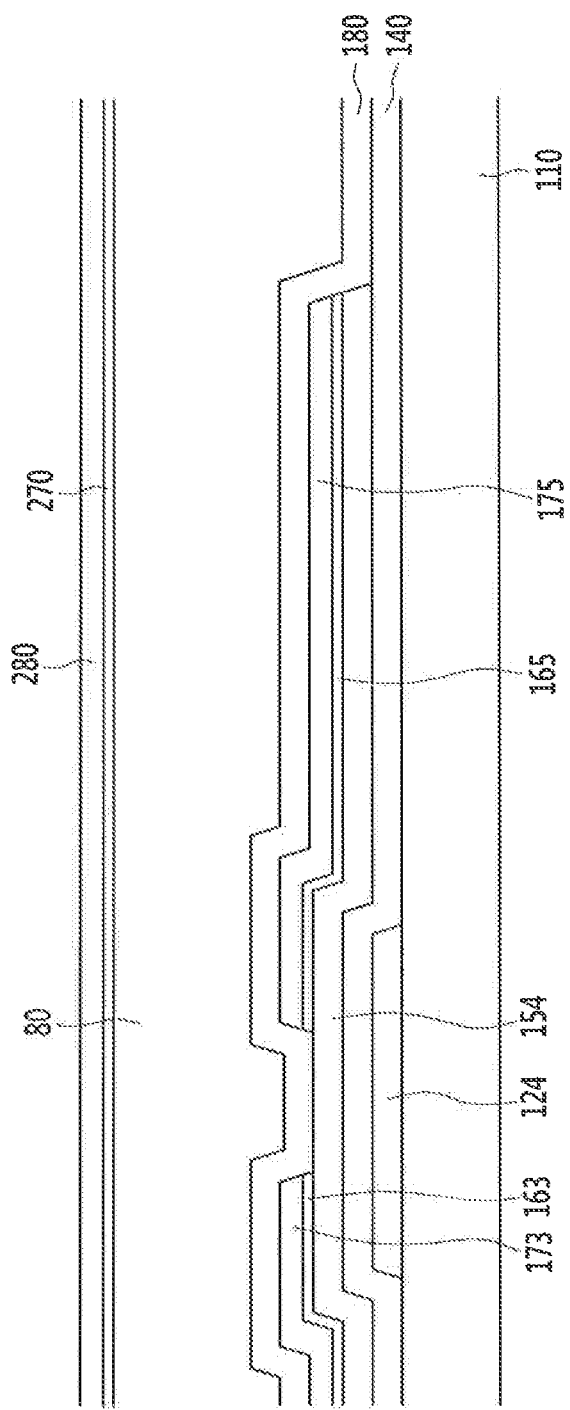
Figure 17:
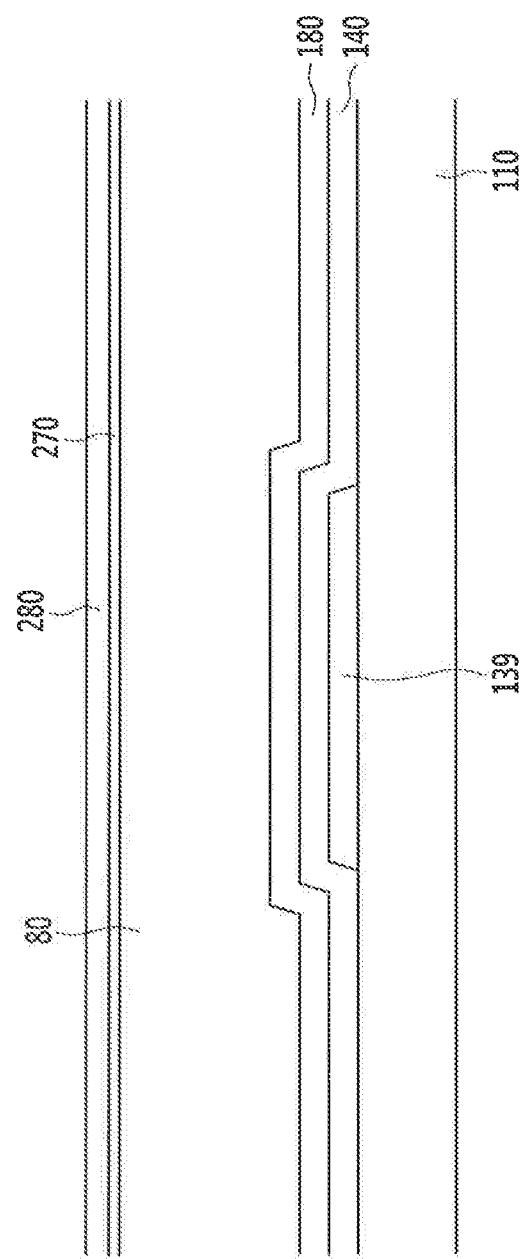
Figure 18:
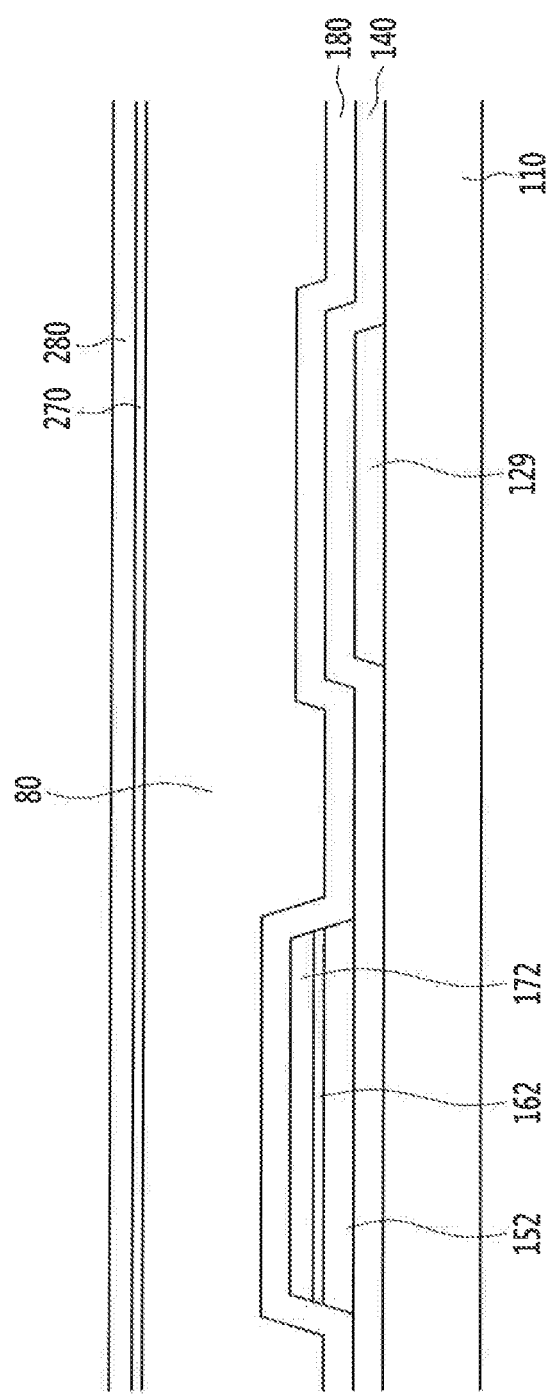
Figure 19:
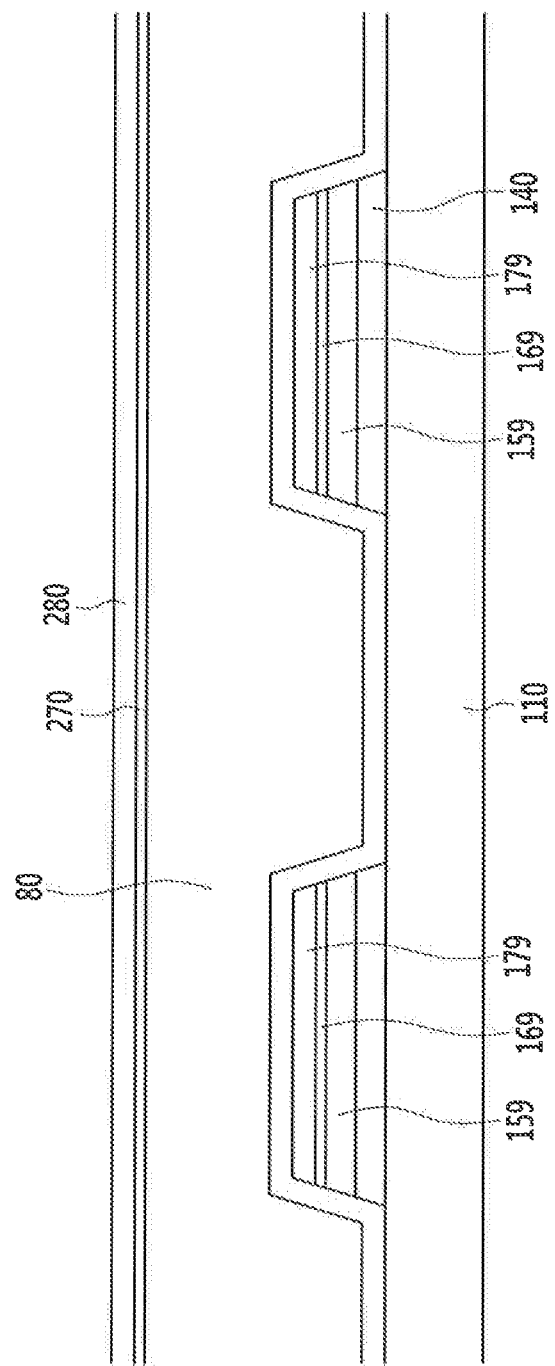

In FIG. 15, since the photosensitive pattern 800 for forming the data pad portion 179 is positioned in the region where the data pad portion 179 is formed, the data conductive layer 170, the ohmic contact layer 160, and the amorphous silicon layer 150 excluding the data pad portion 179 formed in a triple layered structure of 159, 169, and 179 are removed.

Referring to FIGS. 16 to 19, a first passivation layer 180, an organic layer 80, a common electrode conductive layer 270, and a second passivation layer 280 are laminated on the gate insulating layer 140, the semiconductor layer 154, and the data conductors 171, 173, 175, and 179 of the resulting structures of FIGS. 12 to 15, respectively.

Referring to FIGS. 20 to 23, another photosensitive pattern 810 is formed on the laminated second passivation layer 280 to form a plurality of contact holes.

Figure 20:
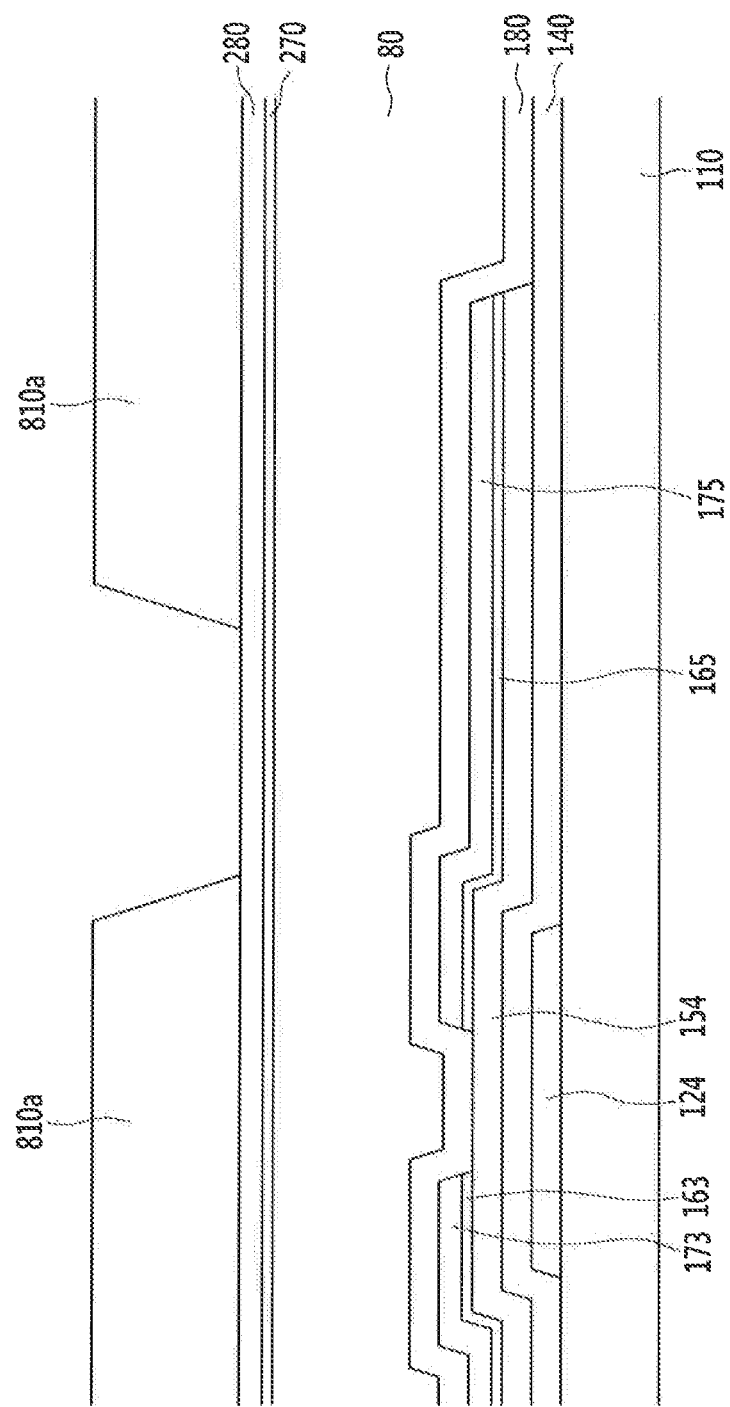

In FIG. 20, the photosensitive pattern 810a for forming the first contact hole 185a of FIG. 4 exposing the drain electrode 175 is formed to have the first thickness.

Figure 21:
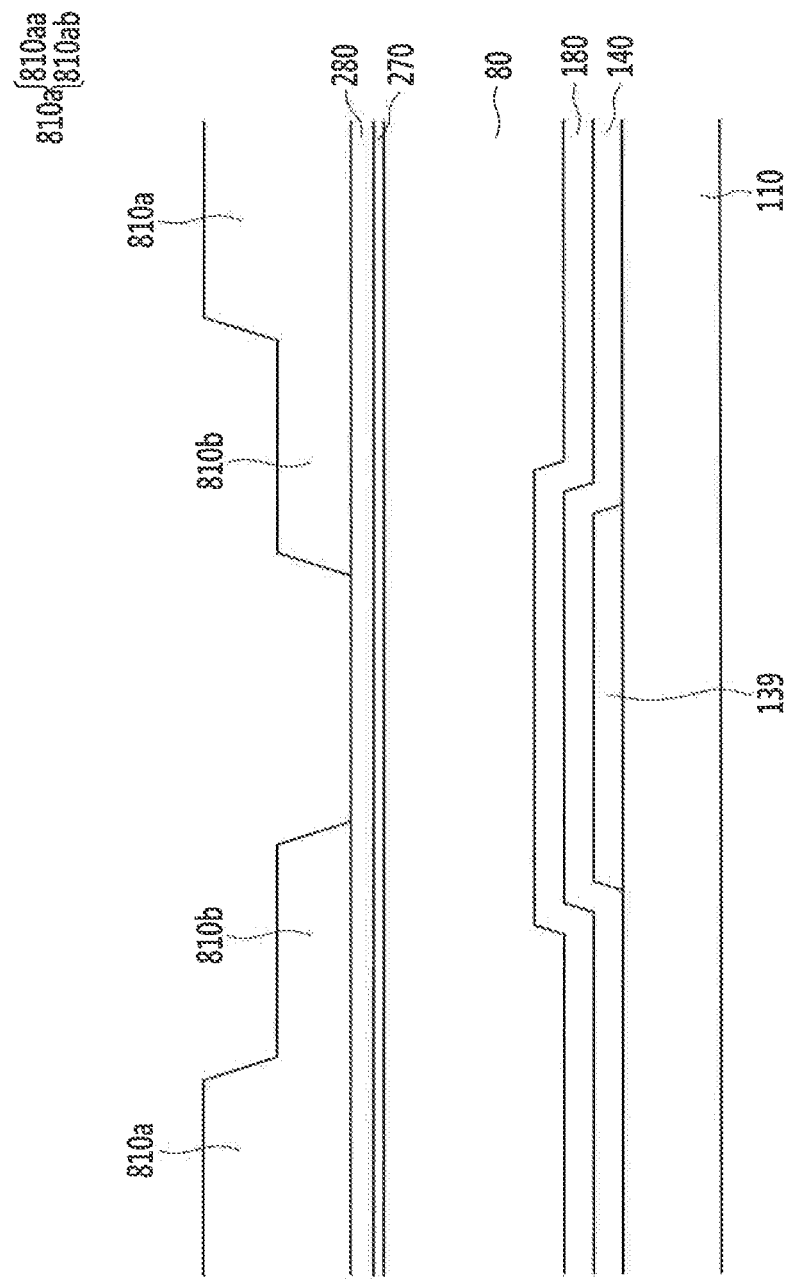

In FIG. 21, the photosensitive pattern 810 for forming the second contact hole 185b of FIG. 5 exposing the storage electrode pad portion 139 is formed to have the second thickness that is half the first thickness. In this case, the photosensitive pattern 810 for the second contact hole 185b has a first region 810a having the first thickness and a second region 810b having the second thickness. The second region 810b is closer to the second contact hole 185b than the first region 810a.

Figure 22:
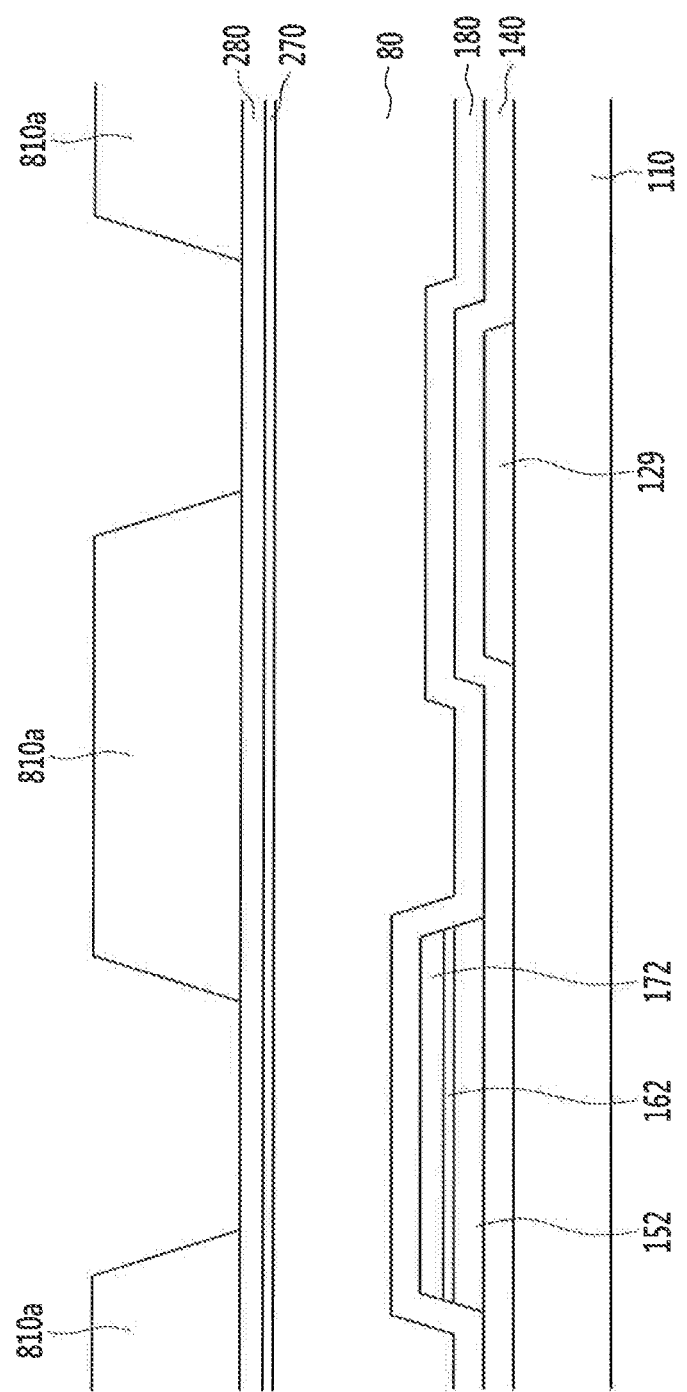

In FIG. 22, the photosensitive pattern 810a having the first thickness is formed in regions where the third contact holes 185c and 185d exposing the gate pad portion 129 and the data layer signal line 172 of FIG. 6 coupled thereto are formed.

Figure 23:
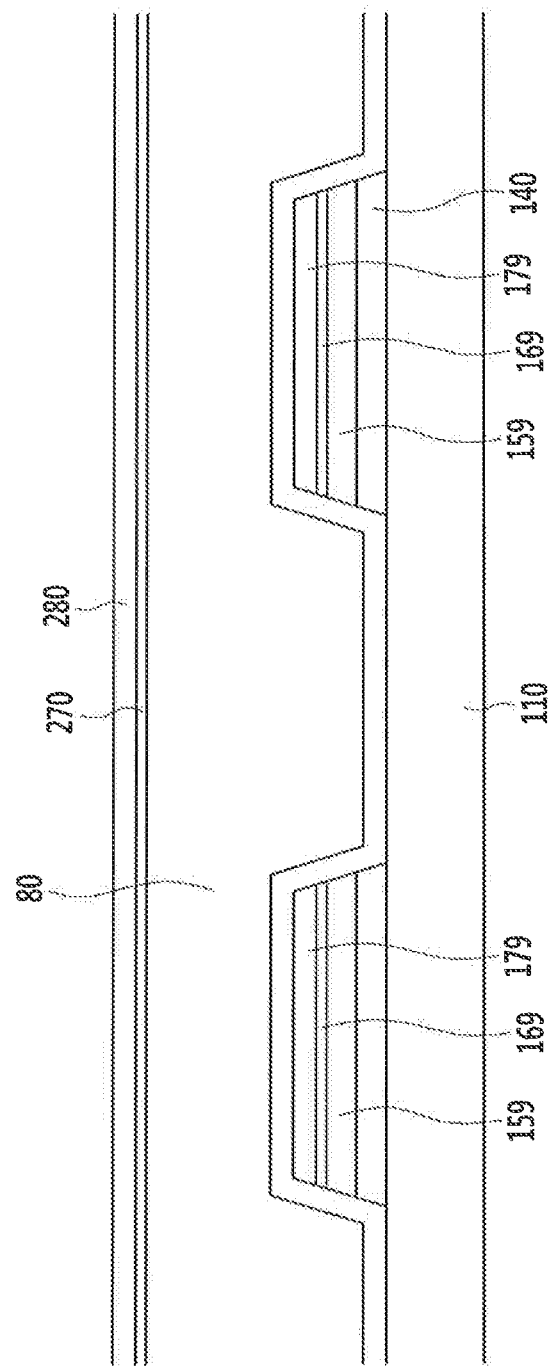
Figure 24:
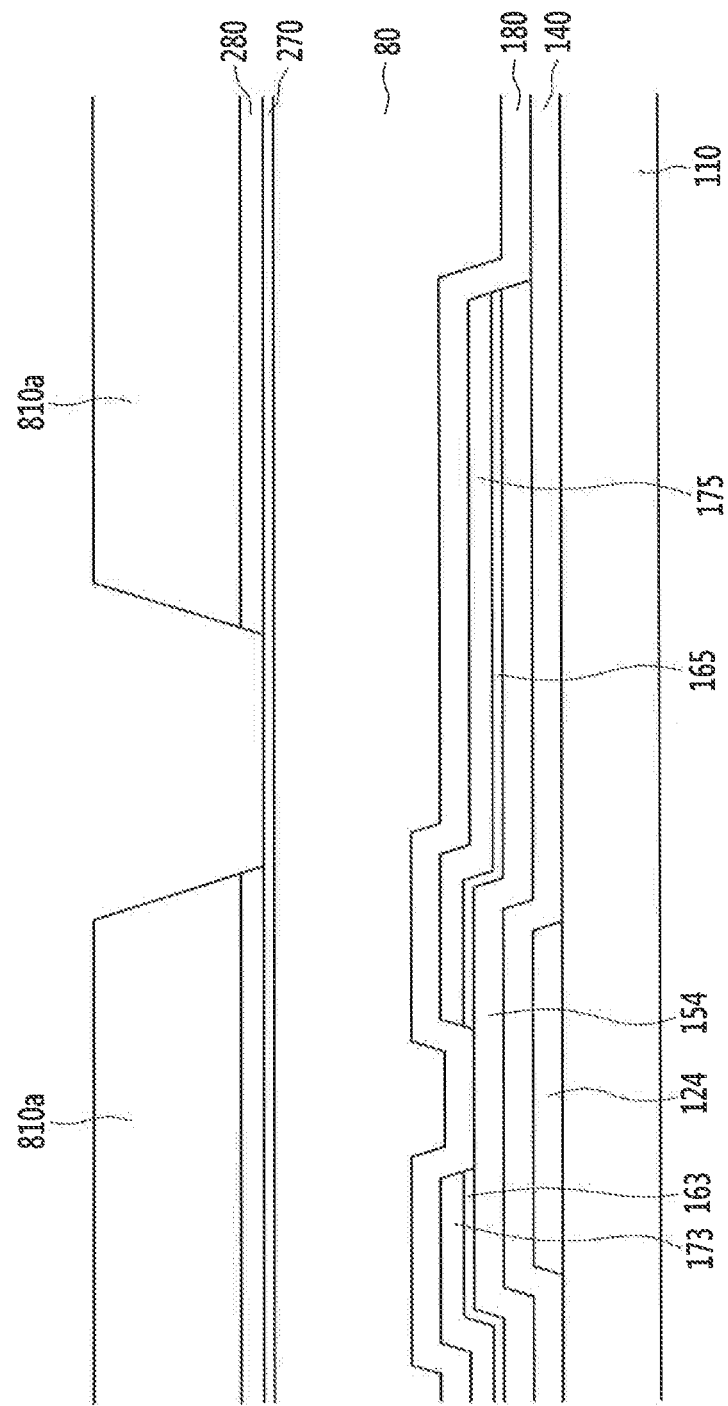
Figure 25:
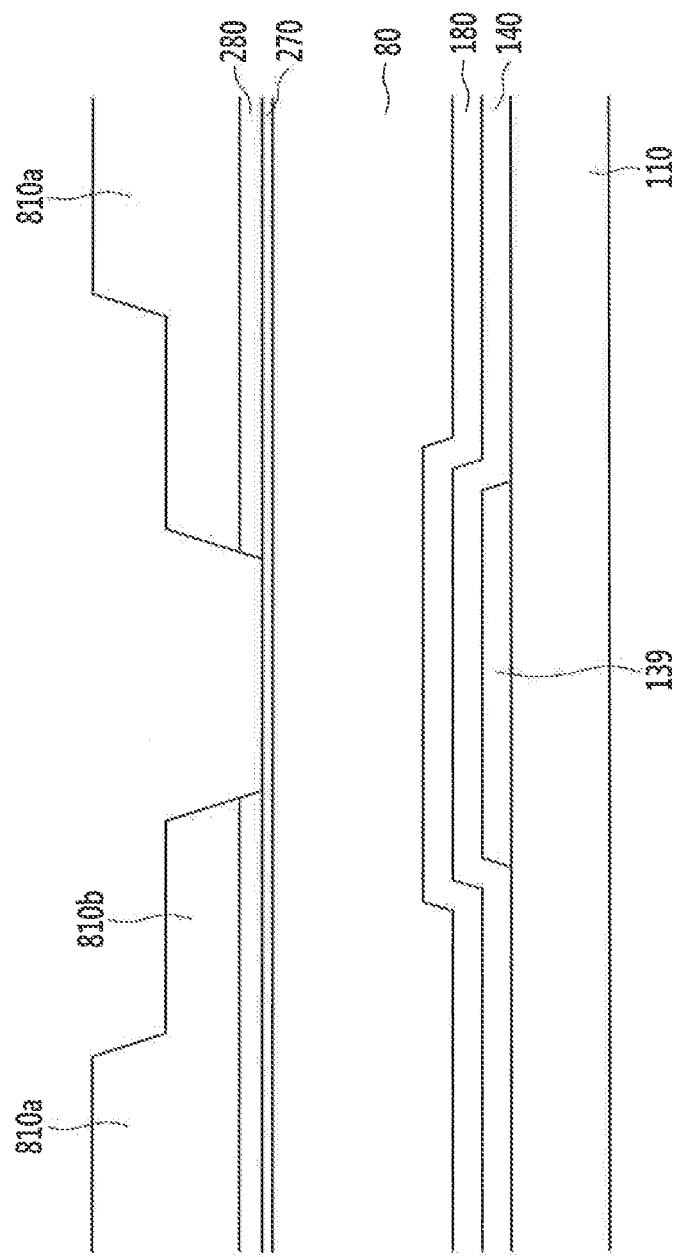
Figure 26:
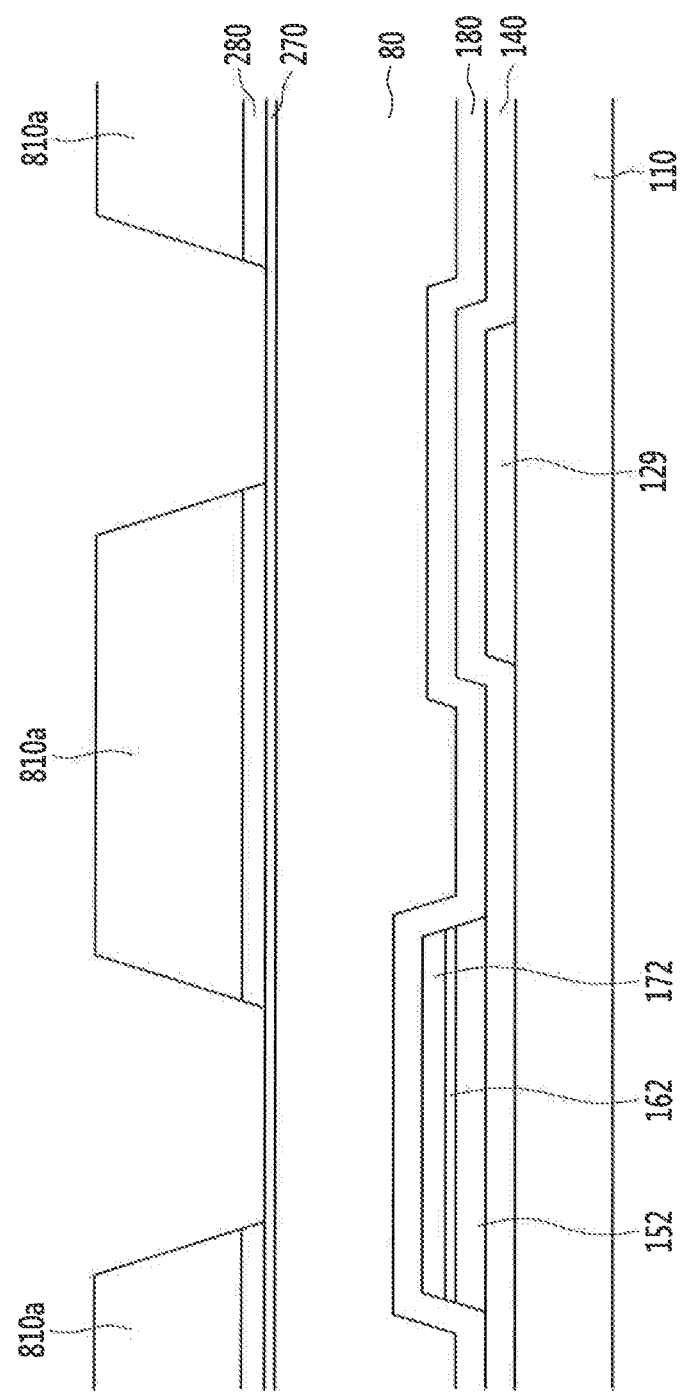
Figure 27:
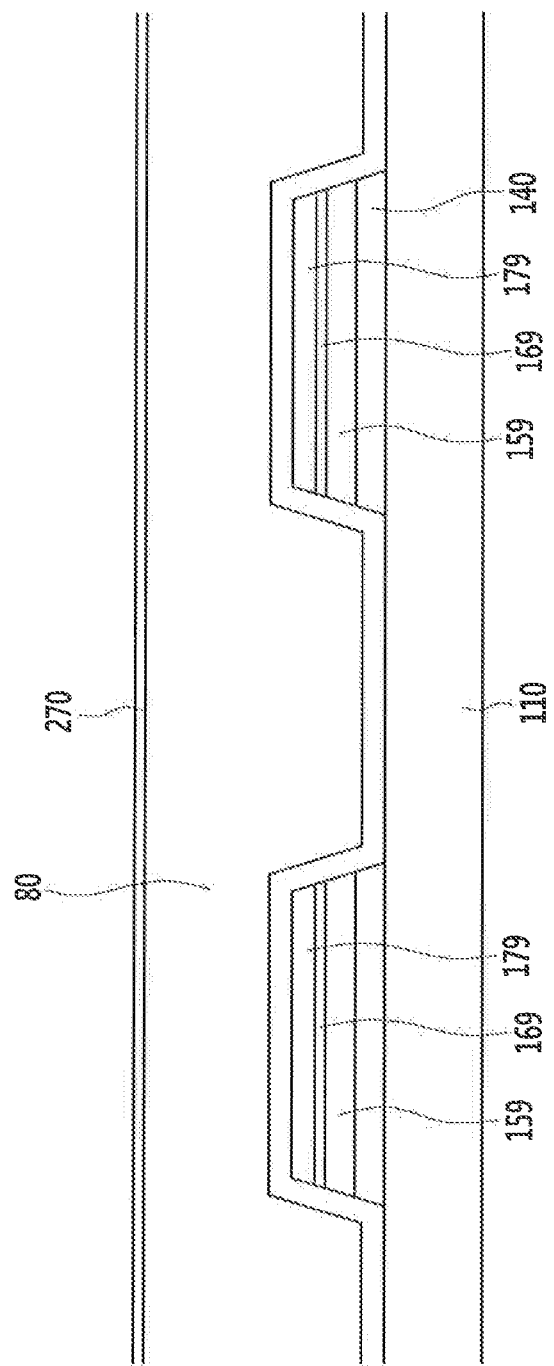
Figure 28:
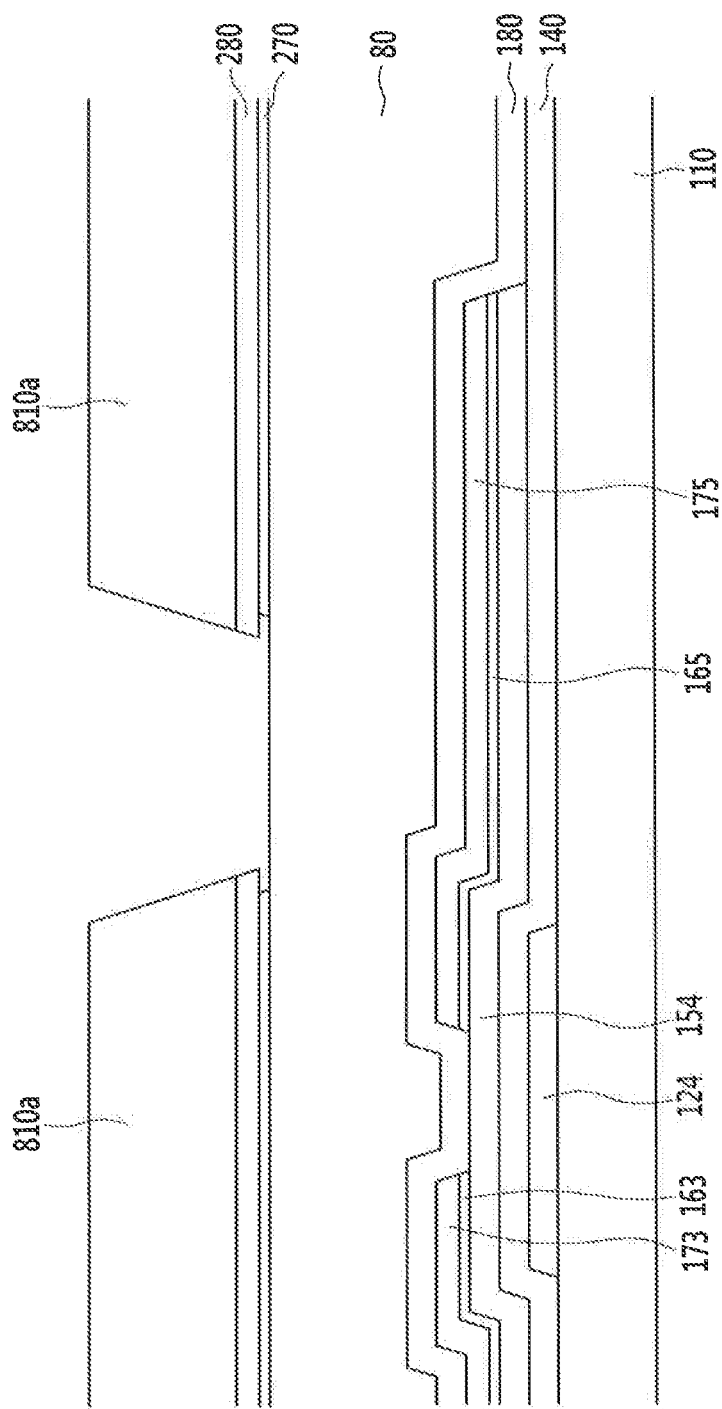
Figure 29:
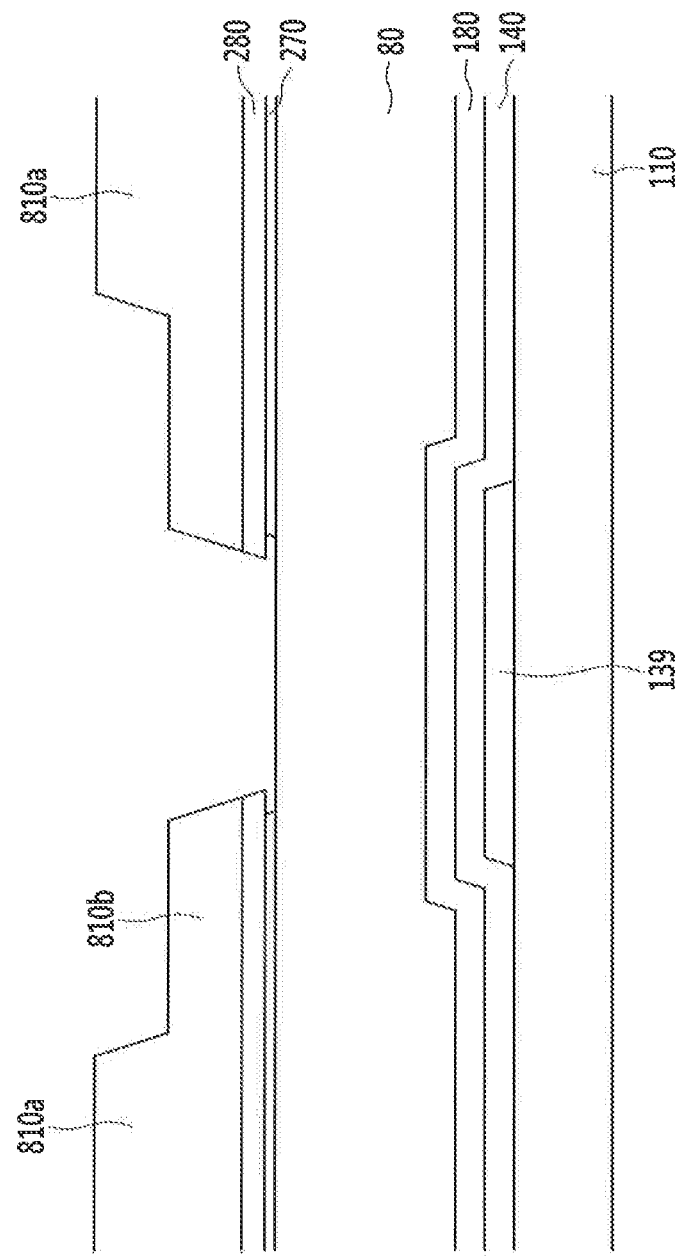
Figure 30:
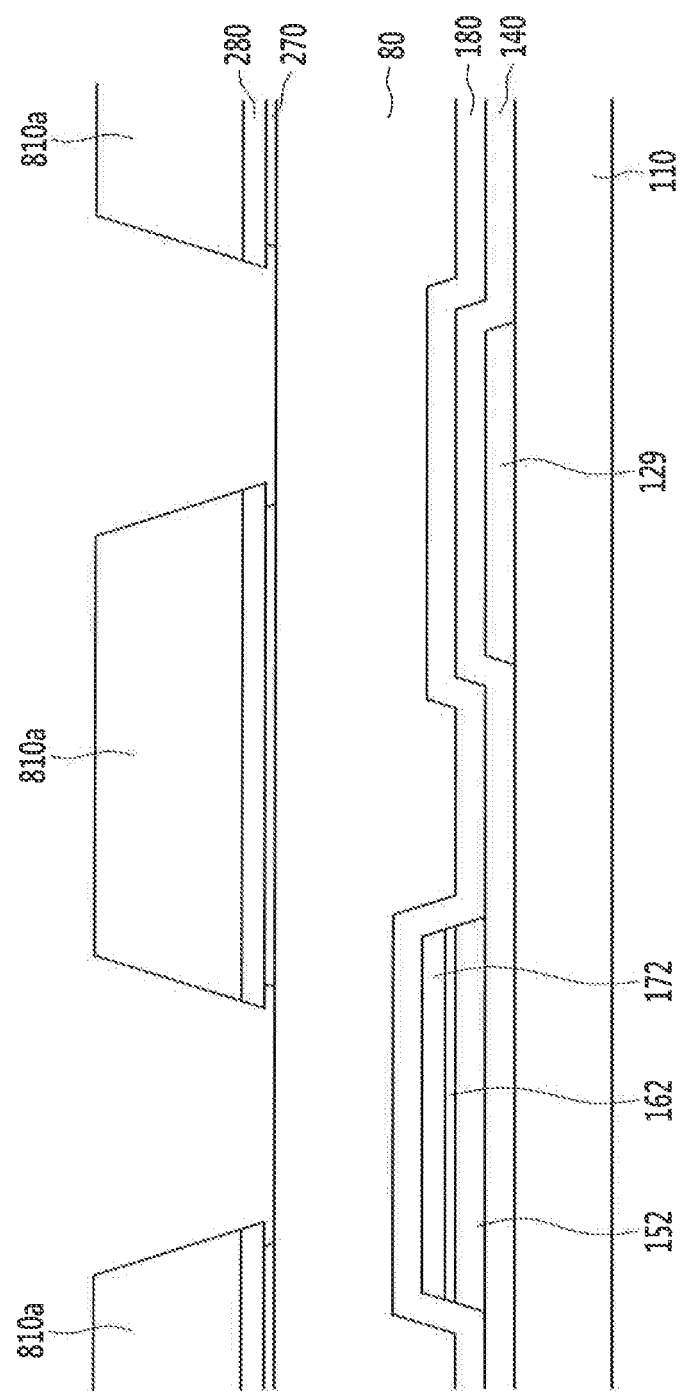
Figure 31:
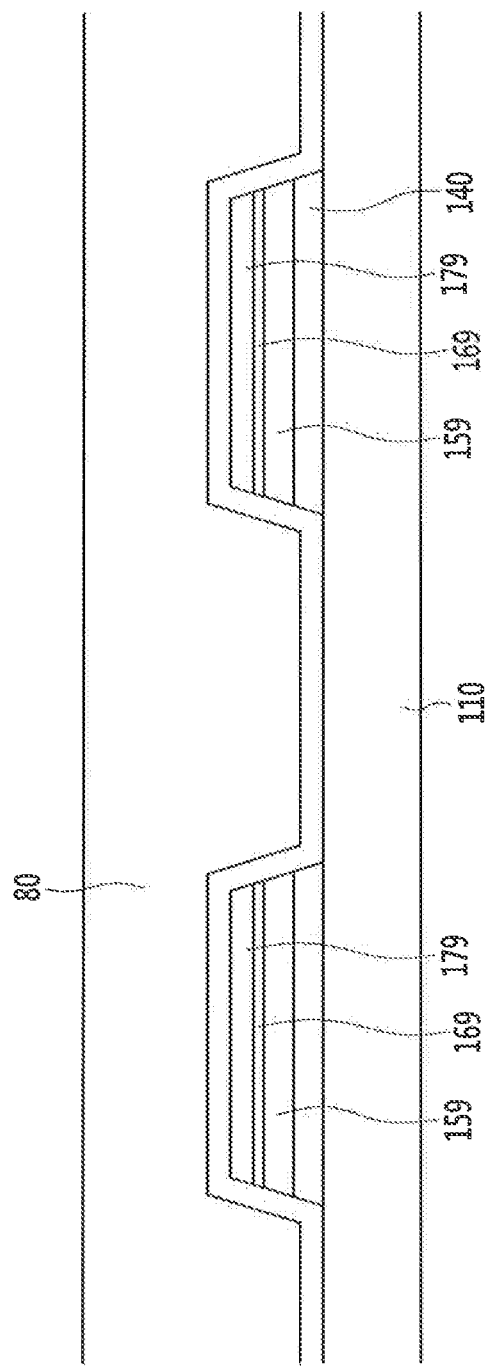
Figure 32:
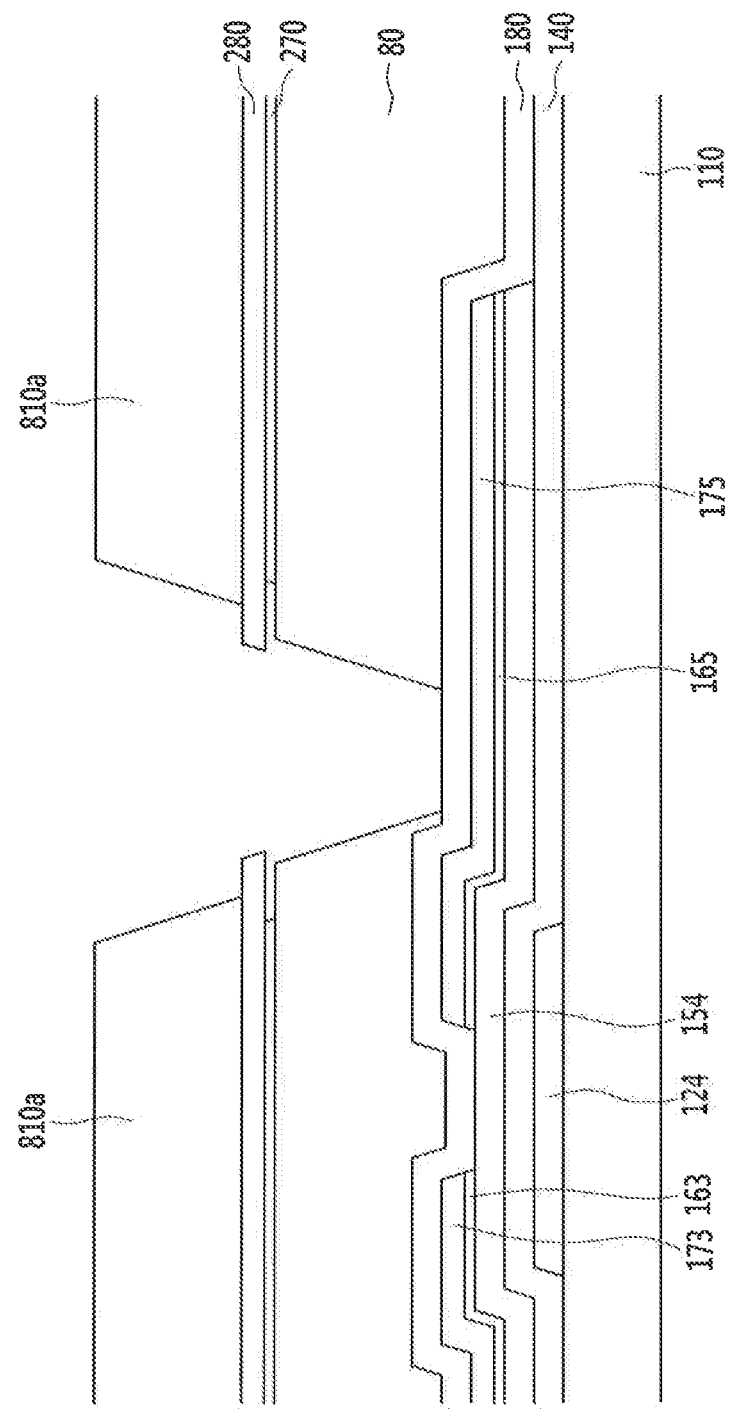
Figure 33:
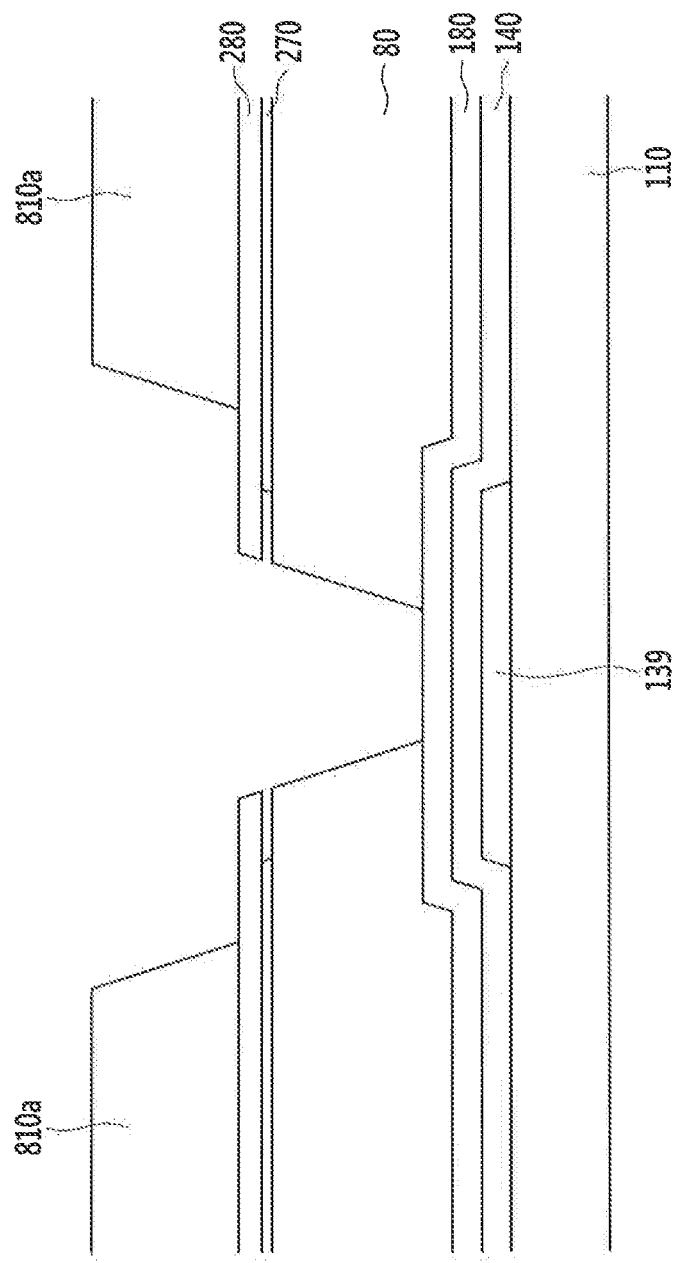
Figure 34:
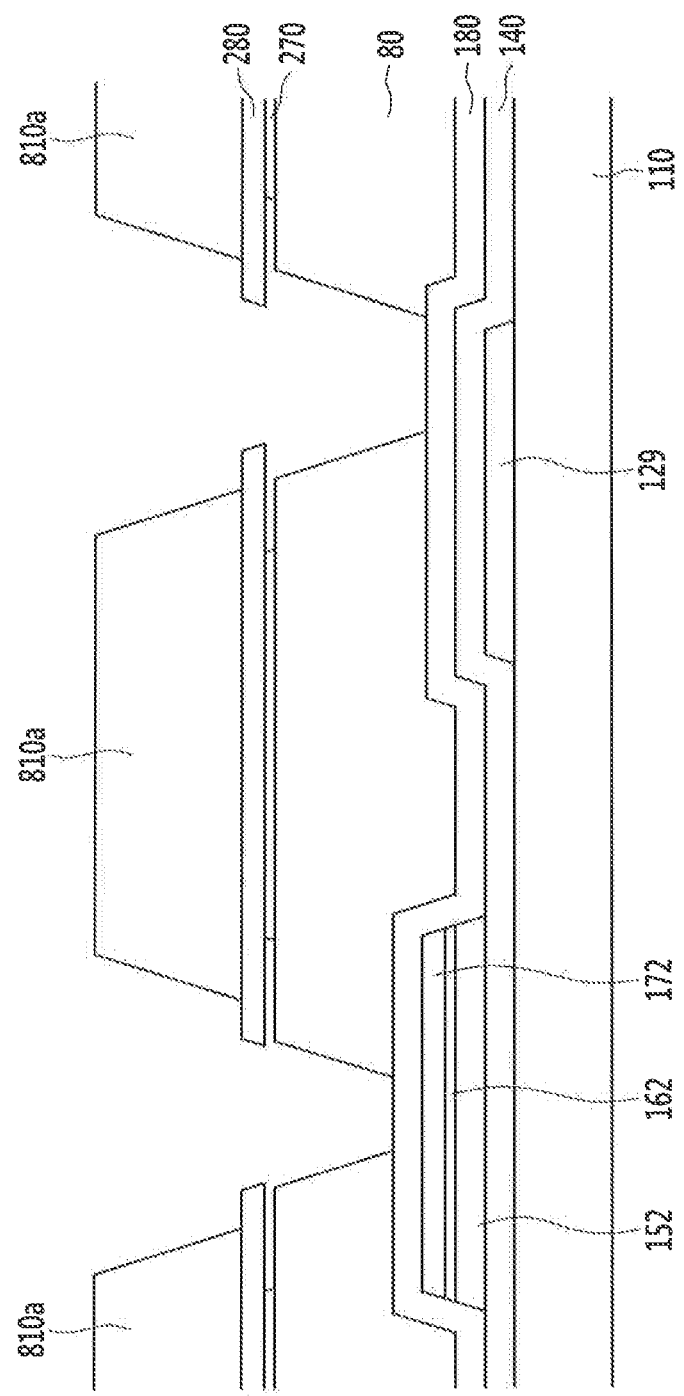
Figure 35:
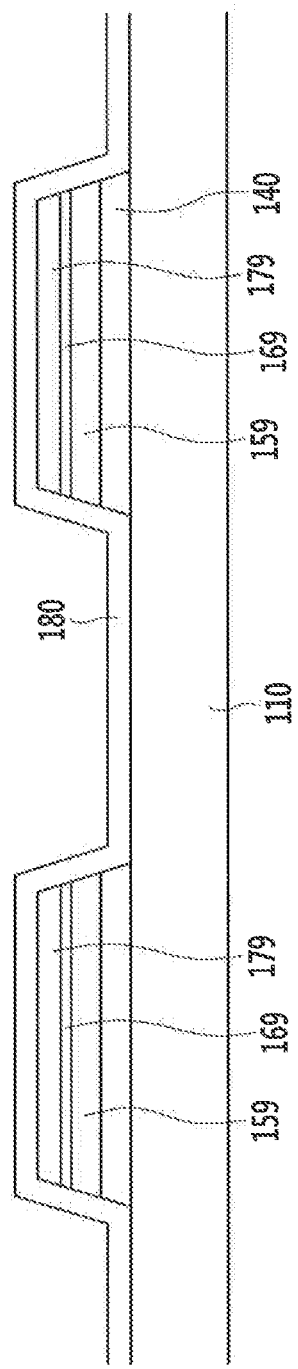

In FIG. 23, no photosensitive pattern 810 is positioned in a region where the fourth contact hole 185e exposing the data pad portion 179 is formed.

Referring to FIGS. 24 to 27, the second passivation layer 280 is etched using the aforementioned photosensitive pattern 810 as a mask.

Then, as shown FIGS. 28 to 31, the common electrode conductive layer 270 is etched using the etched second passivation layer 280 and the photosensitive pattern 810 as a mask to form a common electrode 270.

In this case, the common electrode 270 may be over-etched further than the second passivation layer 280 to form an empty space under the second passivation layer 280.

For example, the common electrode 270 may be etched by a wet etching method using an Indium Tin Oxide (ITO) etchant or the like to the extent that the empty space under the second passivation layer 280 is formed.

Next, referring to FIGS. 32 to 35, the organic layer 80 is etched using the photosensitive pattern 810, the second passivation layer 280, and the common electrode 270 as masks.

In this case, the photosensitive pattern 810 having the first thickness is also etched to become the photosensitive pattern 810b having the second thickness, and the photosensitive pattern 810b having the second thickness is removed. The present invention is not limited thereto, and after the etching process, the photosensitive pattern 810a and 810b may have various thickness.

The photosensitive pattern 810 of the region where the second contact hole 185b is positioned is removed of the photosensitive pattern of the second thickness to be formed inward such that a larger contact hole than that formed in the common electrode 270 is formed.

Next, referring to FIGS. 36 to 39, the first passivation layer 180 is etched using the photosensitive pattern 810 as a mask.

Accordingly, a first part 185a-1 of the first contact hole 185a defined by the etched first passivation layer 180 is smaller than a second part 185a-2 of the first contact hole defined by the common electrode 270.

Figure 36:
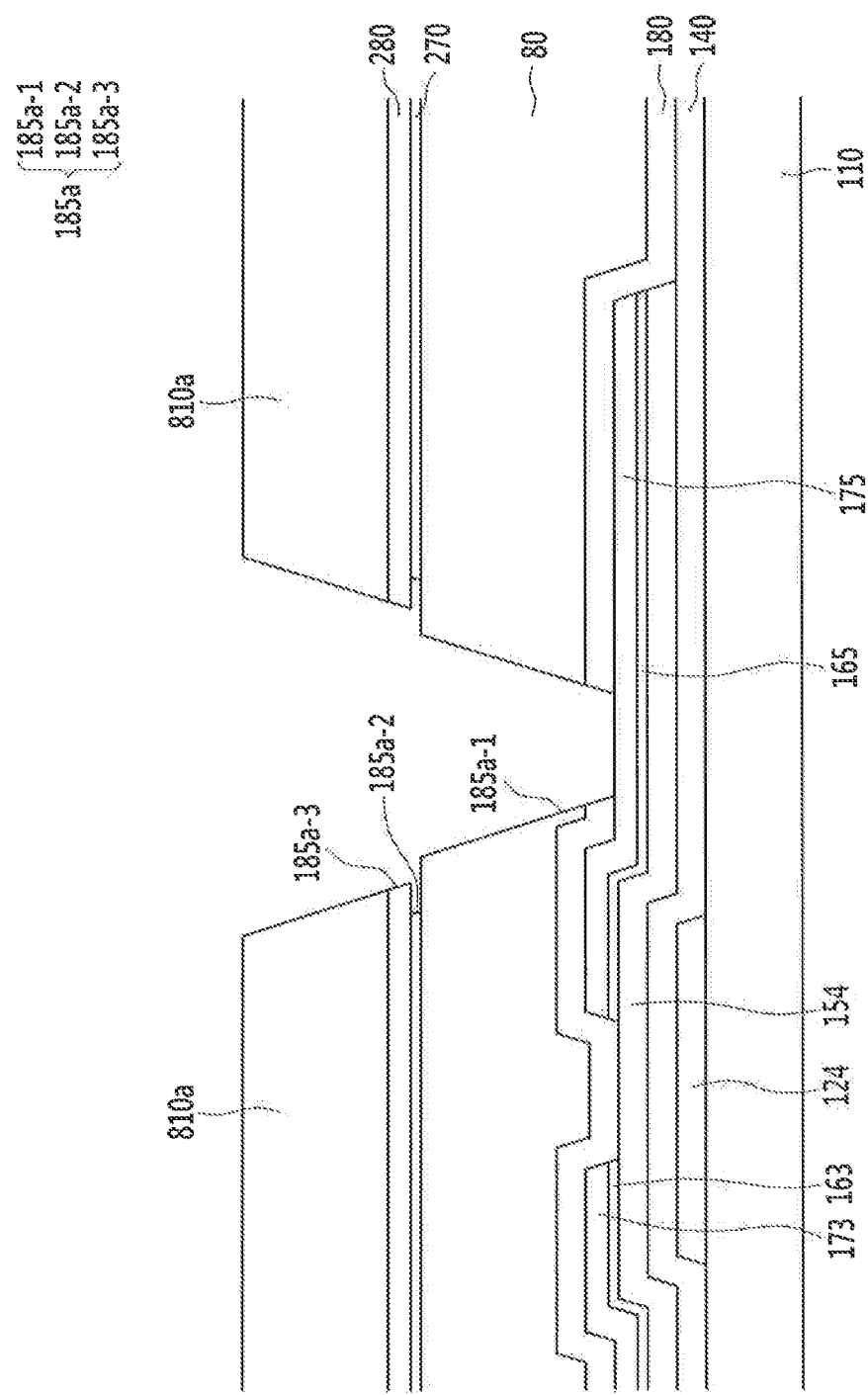

In FIG. 36, when the first passivation layer 180 is etched using the photosensitive pattern 800 as the mask, the second passivation layer 280 is also etched to the extent that a third part 185a-3 of the first contact hole 185a defined by the second passivation layer 280 is smaller than the second part 185a-2 of the first contact hole 185a defined by the common electrode 270.

Figure 37:
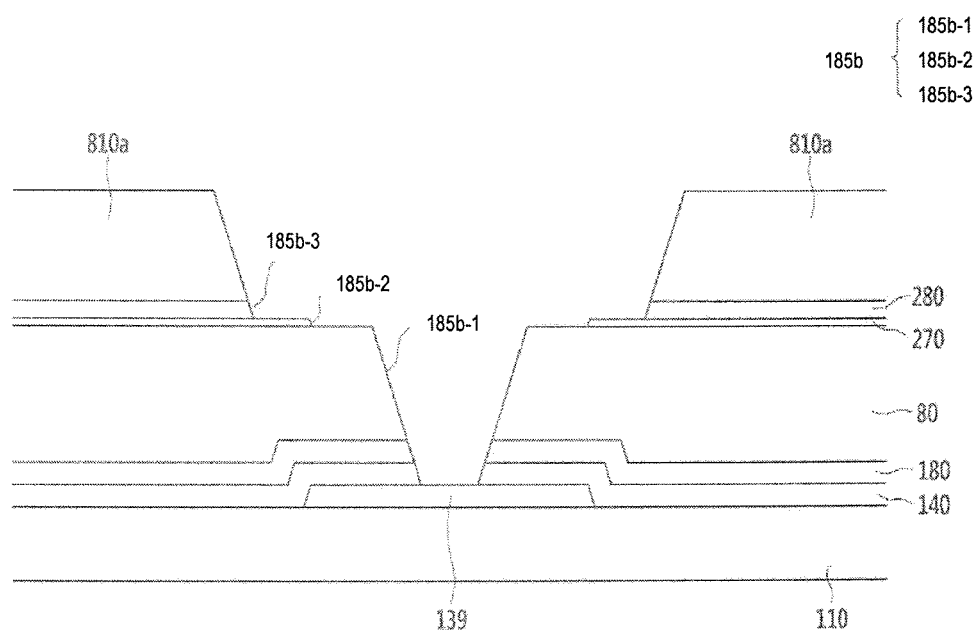

In FIG. 37, the second passivation layer 280 that are positioned in the region where the second contact hole 185b is positioned is etched using the photosensitive pattern 810 as a mask to the extent that a third part 185b-3 of the second contact hole 185b defined by the second passivation layer 280 is larger than a second part 185b-2 of the second contact hole 185b defined by the common electrode 270.

Accordingly, the second passivation layer 280 partially exposes the common electrode 270.

Figure 38:
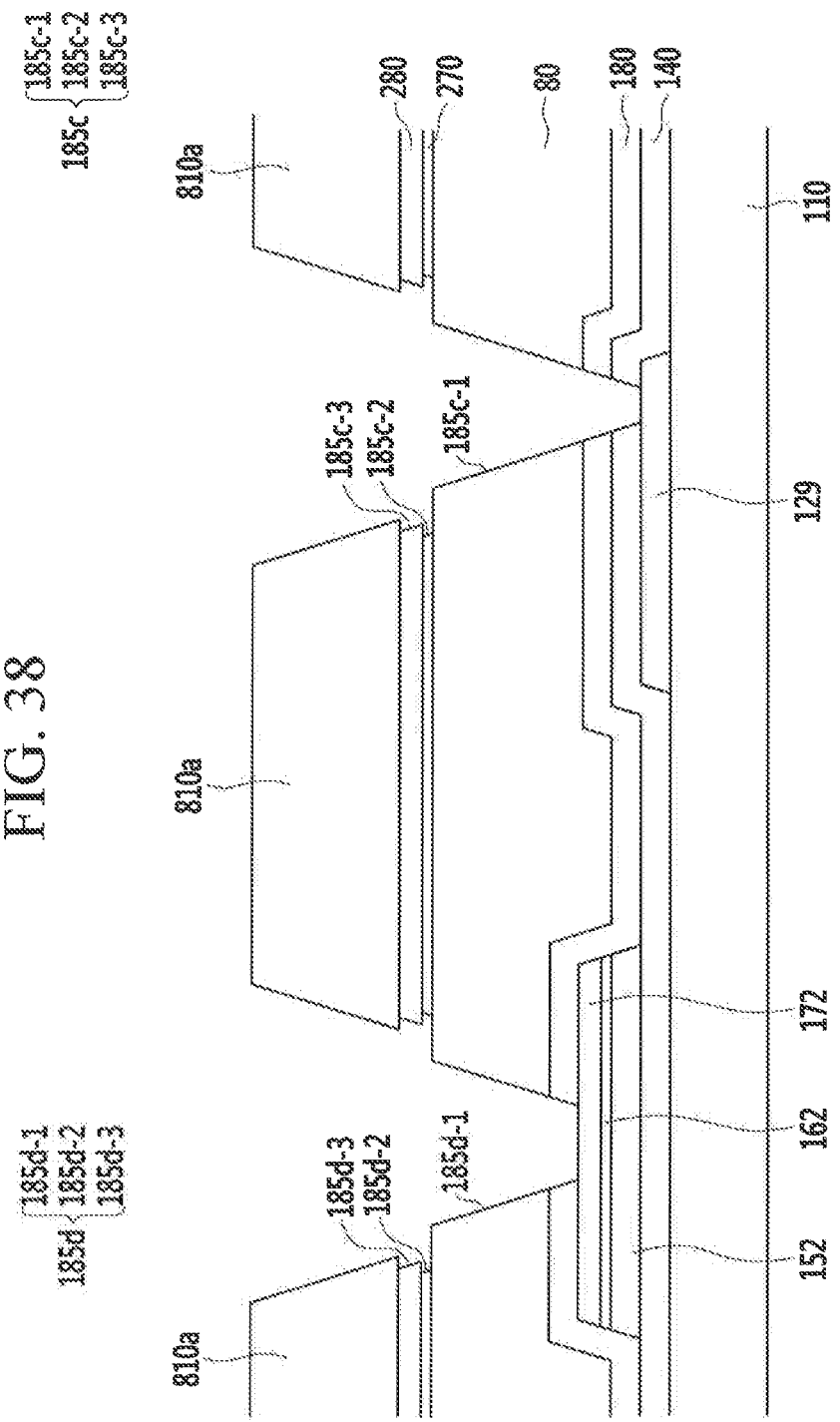
Figure 39:
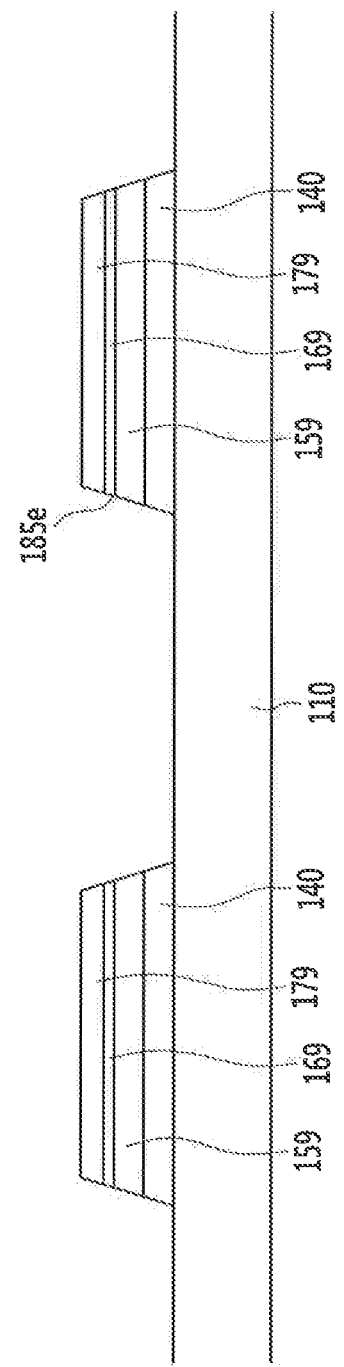

In FIG. 38, the second passivation layer 280 that are positioned in the region where the third contact hole 185c is positioned is etched using the photosensitive pattern 810 as a mask to the extent that a third part 185c-3 of the third contact hole 185c defined by the second passivation layer 280 is smaller than a second part 185c-2 of the third contact hole 185c defined by the common electrode 270.

Similarly, the second passivation layer 280 that is positioned in the region where the fourth contact hole 185d is positioned is etched using the photosensitive pattern 810 as a mask to the extent that a third part 185d-3 of the fourth contact hole 185d defined by the second passivation layer 280 is smaller than a second part 185d-2 of the fourth contact hole 185d defined by the common electrode 270.

Next, the photosensitive pattern 810 is removed from the resulting structures of FIGS. 36 to 39. And then, the pixel electrode 191 and the contact assistants 91, 92, and 93 are formed by laminating and then patterning the pixel electrode conductive layer. The thin film transistor array panel of FIGS. 4 to 7 may be formed.

Referring back to FIGS. 2 to 7, the drain electrode 175 exposed by the first contact hole 185a is coupled to the pixel electrode 191. The storage electrode pad portion 139 exposed by the second contact hole 185b is coupled to the common electrode 270 through the first contact assistant 91.

The gate pad portion 129 exposed by the third contact hole 185c is coupled to the data layer signal line 172 exposed by the fourth contact hole 185d through the second contact assistant 92. The data pad portion 179 may be coupled to another signal line (not shown) and the like through the third contact assistant 93.

To prevent the pixel electrode 191 and the common electrode 270 from being short-circuited in the region where the first contact hole 185a is formed, an empty space 276 is formed under the second passivation layer 280. The empty space 276 is defined by the second passivation layer 280, the common electrode 270 and the organic layer 80. The sidewall of the first contact hole is defined by the first passivation layer 180, the organic layer 80, the common electrode 270 and the second passivation layer 280.

The empty space is provided to prevent the pixel electrode 191 and the common electrode 270 from being short-circuited. For example, when the pixel electrode 191 is formed in the first contact hole, the empty space 276 is not filled by the pixel electrode 191.

On the contrary, the second passivation layer 280 partially exposes the common electrode 270 in the second contact hole 185b for applying the common voltage to the storage electrode line 131, such that the exposed common electrode 270 and storage electrode line 131 are coupled through the first contact assistant to be applied with the common voltage. The sidewall of the second contact hole 185b is defined by the gate insulating layer 140, the first passivation layer 180, the organic layer 80, the common electrode 270 and the second passivation layer 280.

According to the aforementioned manufacturing method of the thin film transistor array panel, the thin film transistor array panel may be provided through the four-mask process, thereby reducing manufacturing cost and manufacturing time of the display panel.

A thin film transistor array panel according to an exemplary embodiment of the present invention will now be described with reference to FIGS. 40 to 45.

Figure 40:
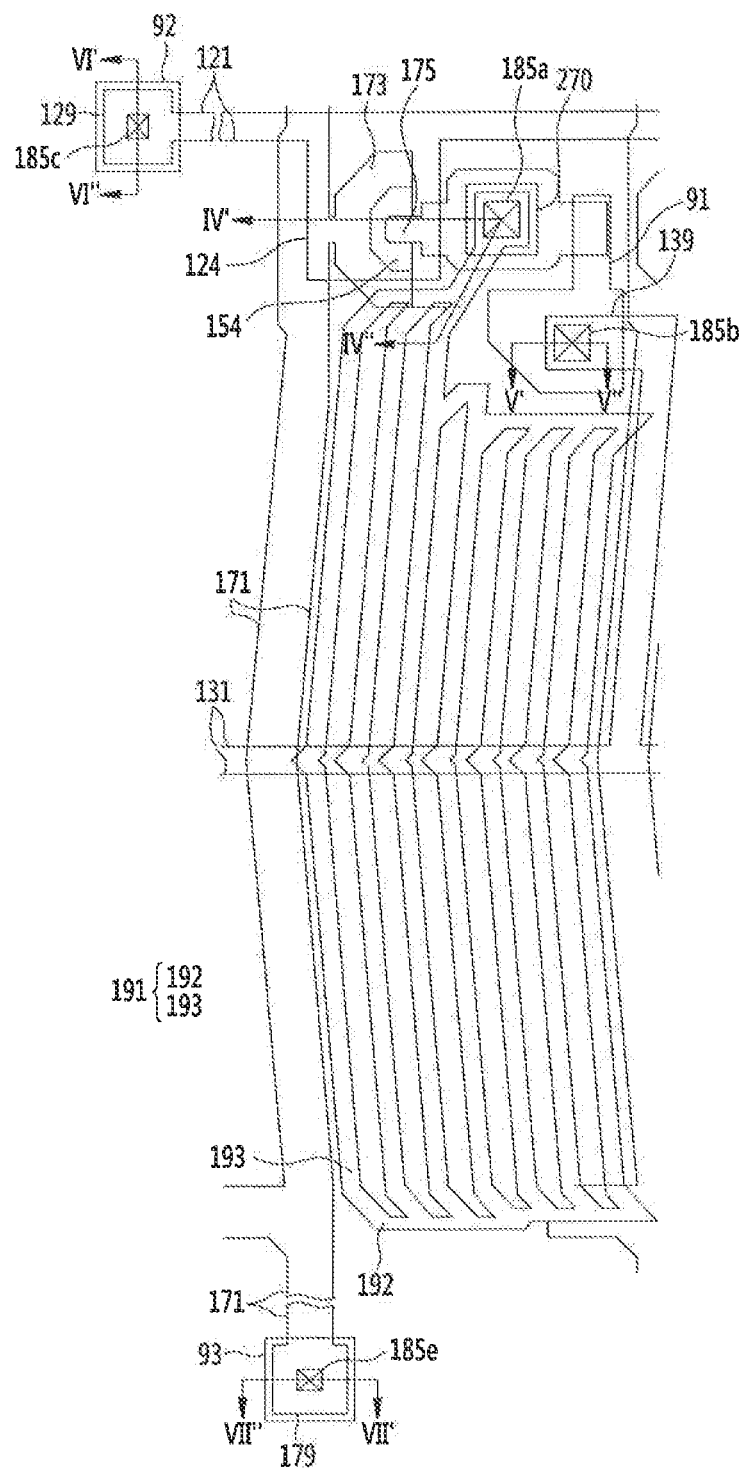
FIG. 40 is a top plan view of one pixel of a thin film transistor array panel according to an exemplary embodiment of the present invention.
Figure 41:
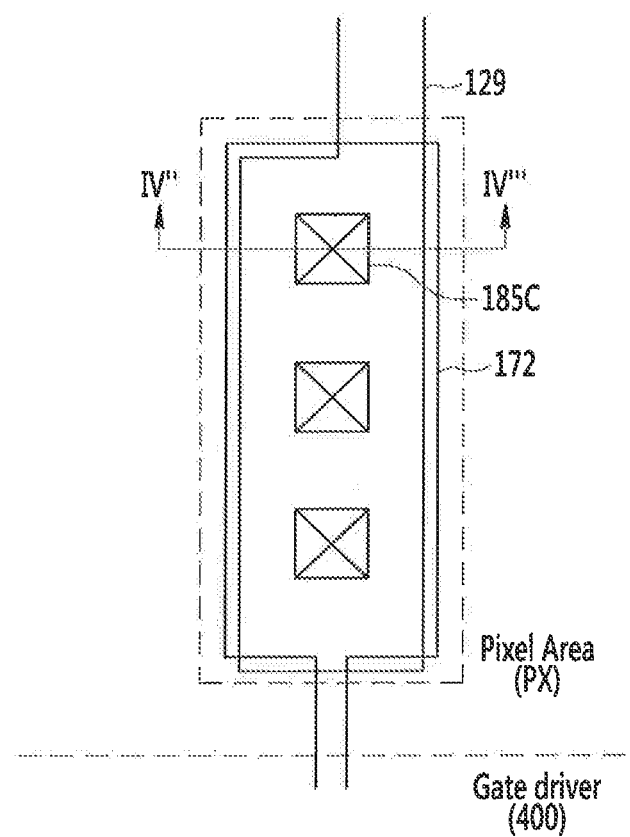
FIG. 41 is a partial top plan view of a gate pad portion and a signal line region according to an exemplary embodiment of the present invention.
Figure 42:
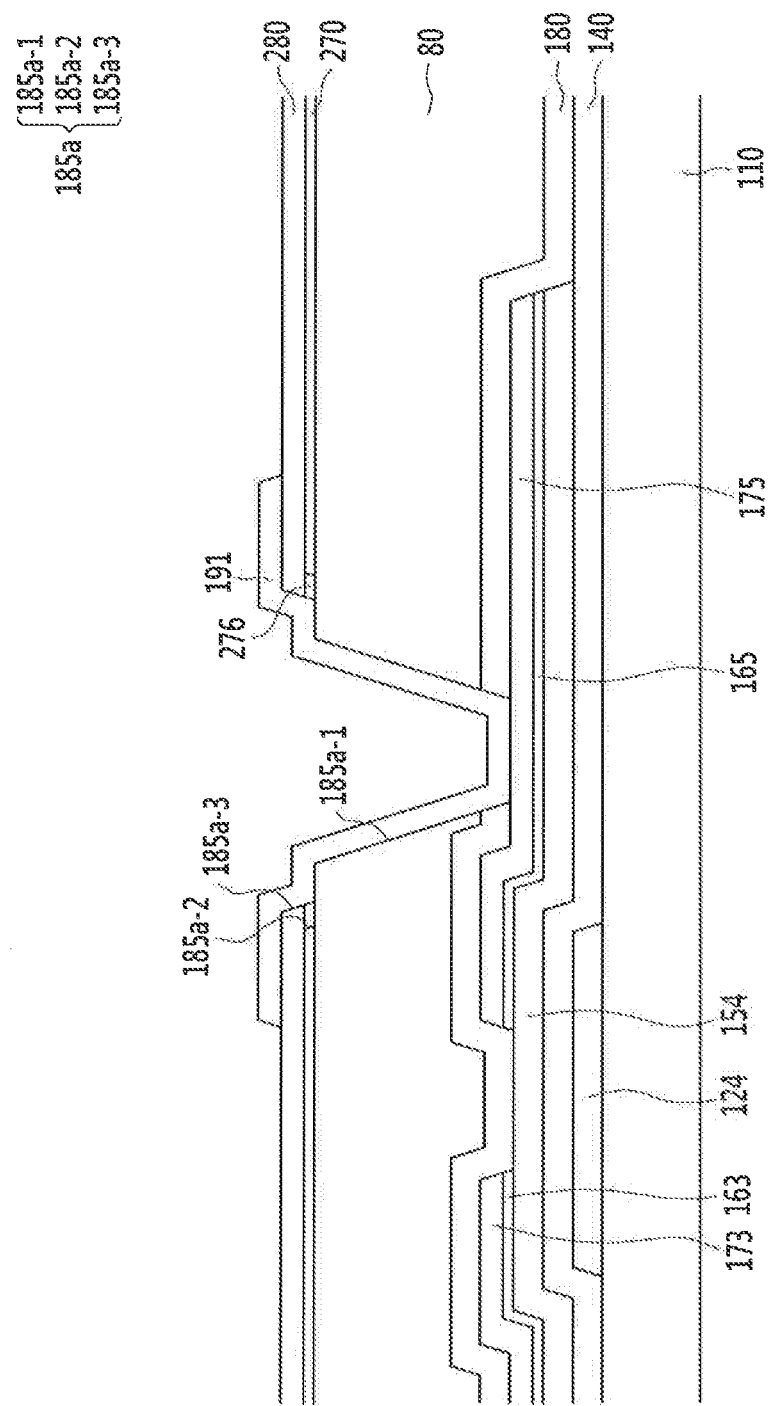
FIG. 42 is a cross-sectional view of FIG. 40 taken along line IV'-IV'''.
Figure 43:
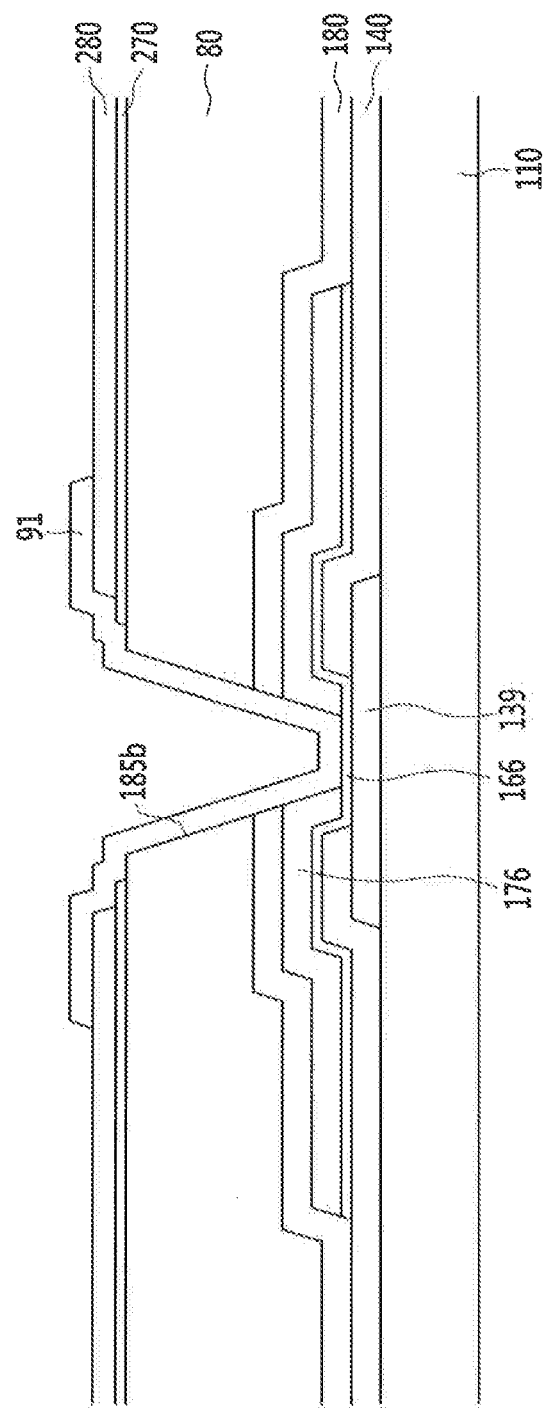
FIG. 43 is a cross-sectional view of FIG. 40 taken along line V'-V'''.
Figure 44:
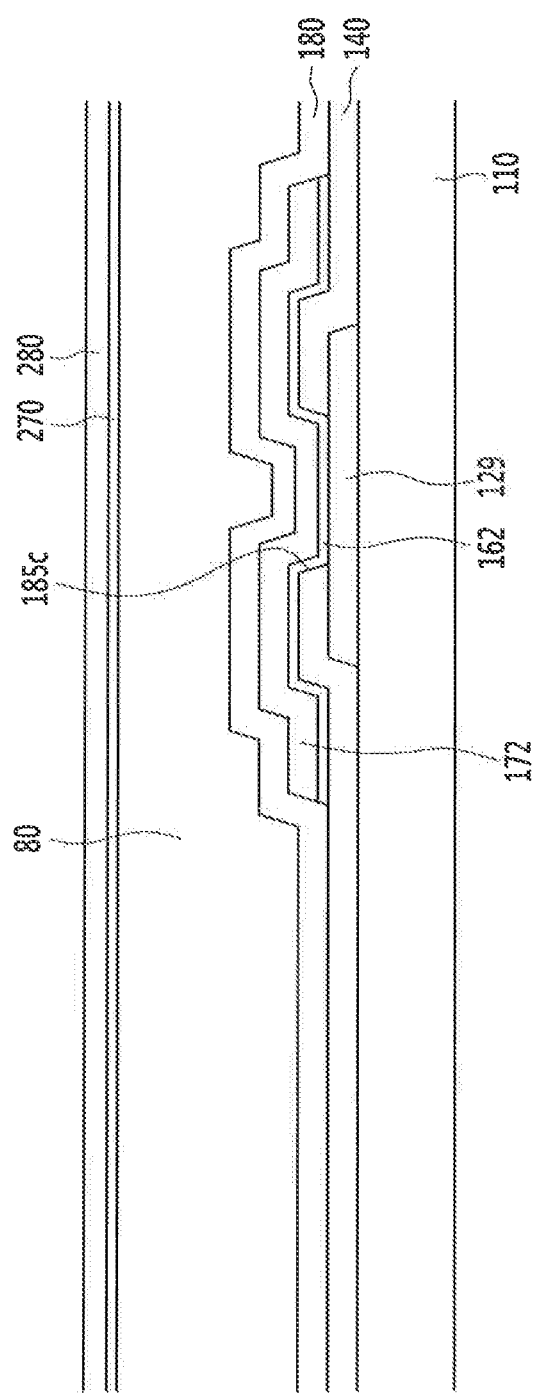
FIG. 44 is a cross-sectional view of FIG. 40 taken along line VI'-VI'''.
Figure 45:
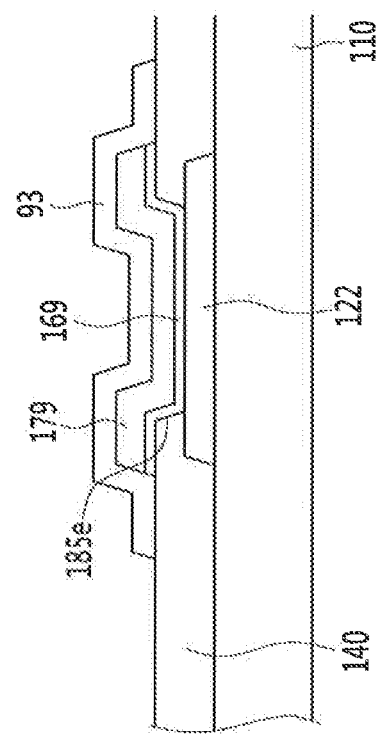
FIG. 45 is a cross-sectional view of FIG. 40 taken along line VII'-VII'''.

FIG. 40 is a top plan view of one pixel of a thin film transistor array panel according to an exemplary embodiment of the present invention, FIG. 41 is a partial top plan view of a gate pad portion and a signal line region according to an exemplary embodiment of the present invention, FIG. 42 is a cross-sectional view of FIG. 40 taken along line IV'-IV'', FIG. 43 is a cross-sectional view of FIG. 40 taken along line V'-V'', FIG. 44 is a cross-sectional view of FIG. 40 taken along line VI'-VI'', and FIG. 45 is a cross-sectional view of FIG. 40 taken along line VII'-VII''.

First, a plurality of gate lines 121, a plurality of storage electrode lines 131, and a plurality of gate layer signal lines 122 are positioned on an insulation substrate 110 that is formed of transparent glass or plastic.

The gate lines 121 transmit a gate signal and extend mainly in a horizontal direction.

Each gate line 121 includes a plurality of protruding gate electrodes 124, and a wide gate pad portion 129 for connection with another layer or an external driving circuit.

The gate line 121 positioned in the pixel area PX may be extended to the gate pad portion 129 that is positioned in the gate driver 400 of FIG. 1.

The gate driver 400 for generating the gate signal is mounted directly on the substrate 110, but may be mounted on a flexible printed circuit film (not shown) that is attached on the insulation substrate 110 or integrated into the insulation substrate 110.

The gate layer signal line 122 may be integrally formed with the gate line 121 and the storage electrode line 131, and may be, as shown in FIG. 45, coupled to a data pad portion 179 to transmit a data signal.

The gate layer signal line 122 may be mounted on the flexible printed circuit film that is attached on the insulation substrate 110, or may be integrated into the insulation substrate 110.

The storage electrode lines 131, applied with a predetermined voltage, for example, a common voltage, include stem lines extending in substantially parallel with the gate line 121.

Each storage electrode line 131 is positioned between two adjacent gate lines 121, and may be positioned closer to one of the two gate lines 121 or in the center between the two gate lines 121.

Shapes and arrangements of the storage electrode line 131 are not limited to the aforementioned description and may be variously modified.

The storage electrode line 131 includes a storage electrode pad portion 139 that is coupled to a common electrode 270 to be applied with the common voltage.

The overlapped area of the common electrode 270 and a pixel electrode 191 is reduced, and thus the storage electrode line 131 may compensate a reduced capacitance between the common electrode 270 and the pixel electrode.

The storage electrode pad portion 139 may be positioned in the pixel area PX, and may be coupled to, as shown in FIG. 40, the common electrode 270 that is formed in the pixel area PX, thereby being applied with a common voltage.

The gate conductors 121, 124, and 129 may be formed as a single layer or a multilayer including two or more conductive layers.

The gate layer signal line 122 may be formed as a single layer or a multilayer including two or more conductive layers.

The storage electrode lines 131 and 139 may be formed as a single layer or a multilayer including two or more conductive layers.

For example, the gate conductors 121, 124, and 129, the gate layer signal line 122, and the storage electrode line 131 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

A gate insulating layer 140 is formed on the gate conductors 121, 124, and 129, the gate layer signal line 122, and the storage electrode lines 131 and 139. The gate insulating layer 140 may be formed of an inorganic insulator such as silicon nitride ($SiN_x$), silicon oxide ($SiO_x$), or the like.

A semiconductor layer 154 formed of hydrogenated amorphous silicon (a-Si) or polysilicon is formed on the gate insulating layer 140.

Ohmic contacts 162, 163, 165, 166, and 169 are disposed on the semiconductor layer 154.

The ohmic contacts 162, 163, 165, 166, and 169 may be formed of a material such as n+ hydrogenated amorphous silicon in which an n-type impurity such as phosphor is doped at a high concentration, or of a silicide.

The semiconductor layer 154 may include an oxide semiconductor, and the ohmic contacts 163 and 165 may be omitted if the semiconductor layer 154 is the oxide semiconductor.

Lateral sides of the semiconductor layer 154 and the ohmic contacts 162, 163, 165, 166, and 169 are also inclined with respect to a surface of the insulation substrate, and their inclination angles are about 30° to 80°.

A data line 171 including a source electrode 173 and a data pad portion 179 and a data conductor including a drain electrode 175 are positioned on the ohmic contacts 162, 163, 165, and 169.

In addition, a connecting portion 176 positioned on the storage electrode pad portion 139 and a data layer signal line 172 positioned on the gate pad portion 129 are formed.

The data lines 171 transmit a data signal and extend mainly in a vertical direction to cross the gate lines 121.

Each data line 171 includes the source electrode 173 overlapping the gate electrode 124, and the wide data pad portion 179 that is coupled to a data driver for connection with another layer or an external driving circuit. The source electrode 173 is U-shaped.

The data driver 500 for generating the data signal may be mounted on a flexible printed circuit film (not shown) that is attached on the insulation substrate 110, or may be mounted directly on the insulation substrate 110.

The drain electrode 175 includes one rod-shaped end portion facing the source electrode 173 and the other end portion having a wide area. The drain electrode 175 overlaps the gate electrode 124. The rod-shaped end portion of the drain electrode 175 is surrounded by the U-shaped source electrode 173.

The data layer signal line 172 is positioned on the gate pad portion 129, and may transmit the gate signal to the gate pad portion 129.

The ohmic contact 169 is disposed under the data pad portion 179 and may be omitted.

The data conductors 171, 172, 175, 176, and 179 may be formed as a single layer, or as a multilayer including two or more conductive layers.

The data conductors 171, 172, 175, 176, and 179 are formed of a refractory metal such as chromium (Cr) or an alloy thereof.

The gate electrode 124, the source electrode 173, and the drain electrode 175 form a thin film transistor (TFT) as a switching element along with the semiconductor layer 154.

The semiconductor layer 154 may have substantially the same planar shape as the data conductors 171, 172, 173, 175, and 179 except for its channel region of the thin film transistor.

A first passivation layer 180 is positioned on the data conductors 171, 172, 173, 175, and 179 and the exposed semiconductor layer 154, and the first passivation layer 180 may be formed of an organic insulating material or an inorganic insulating material.

For example, the inorganic insulating material may include silicon nitride and silicon oxide.

The organic insulator may have photosensitivity, and its dielectric constant may be less than about 4.0.

However, the first passivation layer 180 may have a dual-layer structure of a lower inorganic layer and an upper organic layer to ensure an insulating property of the organic layer without damaging the exposed semiconductor layer 154.

Next, an organic layer 80, the common electrode 270, and a second passivation layer 280 are positioned on the first passivation layer 180.

The present invention is not limited thereto. For example, a color filter (not shown) may be positioned on the first passivation layer 180.

The common electrode 270 is positioned on the organic layer 80.

The sidewall of the first contact hole 185a is defined by the first passivation layer 180, the organic layer 80, the common electrode 270, and the second passivation layer 280. A second part 185a-2 of the sidewall of the first contact hole 185a is larger than a third part 185a-3 of the sidewall of the first contact hole 185a. The second part 185a-2 is defined by the common electrode 270. The third part 185a-3 is defined by the second passivation layer 280. The pixel electrode 191 is formed in the first contact hole 185a to be connected to the drain electrode 175 without being short-circuited to the common electrode 270.

The common electrode 270 may be formed of a transparent conductive material such as ITO or IZO.

The common electrode 270 is positioned in the display area where a plurality of pixels are positioned to display an image.

The common electrode 270 may be formed to have a planar shape on the entire surface of the substrate 110, and may have an opening that is positioned in a region corresponding to a periphery of the drain electrode 175.

The adjacent common electrodes 270 may be coupled to each other to receive the fixed common voltage that is supplied from outside of the display area.

The second passivation layer 280 is positioned on the common electrode 270 to insulate the pixel electrode 191 therefrom, and the second passivation layer 280 may be formed of a material which is substantially the same with or substantially similar to that of the first passivation layer 180.

Next, a pixel electrode 191, a first contact assistant 91, a second contact assistant 92, and a third contact assistant 93 are positioned in the first contact hole 185a, a second contact hole 185b, a third contact hole 185c, and a fourth contact hole 185e.

The pixel electrode 191, the first contact assistant 91, and the third contact assistant 93 may be formed of a transparent conductive material such as ITO or IZO.

Further, a thickness of the pixel electrode 191 may exceed about 500 Å, or may be formed to exceed twice the thickness of the common electrode 270.

The pixel electrode 191 is not short-circuited when the pixel electrode 191 is formed in the first contact hole 185a, because an empty space 276 is formed under the second passivation layer 280. The empty space 276 is defined by the second passivation layer 280, the common electrode 270 and the organic layer 80. The pixel electrode 191 is not filled the empty space 276.

The pixel electrode 191 is electrically coupled to the drain electrode 175 through the first contact hole 185a to receive a data voltage.

The pixel electrode 191 includes a plurality of branch electrodes 193 that extend in substantially parallel with and are separated from each other, and upper and lower horizontal portions 192 that connect upper and lower end portions of the branch electrodes 193.

The branch electrode 193 of the pixel electrode 191 may be bent along the data line 171.

The common electrode 270 formed in a region where the first contact hole 185a is positioned is over-etched so that the empty space 276 is formed between the second passivation layer 280 and the organic layer 80.

For example, the common electrode 270 of the region where the first contact hole 185a is positioned is located further inward than the first passivation layer 180 and the second passivation layer 280.

Accordingly, the pixel electrode 191 formed in the first contact hole 185a is not in contact with the common electrode 270.

On the contrary, referring to FIG. 43, the common electrode 270 protrudes further than the second passivation layer 280 in a region where the second contact hole 185b is positioned.

For example, the second passivation layer 280 partially exposes the common electrode 270.

Thus, the first contact assistant 91 formed in the second contact hole 185b may couple the storage electrode pad portion 139 with the exposed common electrode 270 to apply the common voltage to the storage electrode line 131.

Referring to FIG. 44, the gate pad portion 129 and the data layer signal line 172 may directly contact each other through the third contact hole 185c, and may be applied with the gate signal through the data layer signal line 172.

In the current exemplary embodiment of the present invention, when the data layer signal line 172 and the gate pad portion 129 are coupled to each other through the same contact hole, an area taken by the contact hole decreases and thus the width of a bezel may be decreased.

As shown in FIG. 45, the data pad portion 179 is formed on the gate layer signal line 122 through the fourth contact hole 185e, and the third contact assistant 93 is formed on the data pad portion 179.

The data pad portion 179 may be coupled to an external configuration through the gate layer signal line 122 or the third contact assistant 93, and may receive the data signal.

Though not illustrated, an alignment layer may be coated on the pixel electrode 191 and the second passivation layer 280, and the alignment layer may be a horizontal alignment layer that is rubbed in a predetermined direction.

Alternatively, the alignment layer may include a photo-reactive material to be photo-aligned.

In the current exemplary embodiment of the present invention, unlike the previous exemplary embodiment of the present invention, the gate pad portion 129 and the data layer signal line 172 are coupled to each other in the same contact hole 185c. In addition, the storage electrode pad portion 139 is formed in the pixel area PX. Accordingly, since the data layer signal line 172 is connected to the gate portion 129 using the contact hole 185c disposed in the pixel area PX only and the storage electrode pad portion 139 is formed in the pixel area PX, the bezel size of the display panel assembly 300 may be reduced.

A manufacturing method of thin film transistor display device according to an exemplary embodiment of the present invention will now be described with reference to FIGS. 46 to 57.

Descriptions of the configuration and the manufacturing method that are identical or similar to those of the aforementioned thin film transistor array panel according to the exemplary embodiment of the present invention may be omitted.

Figure 46:
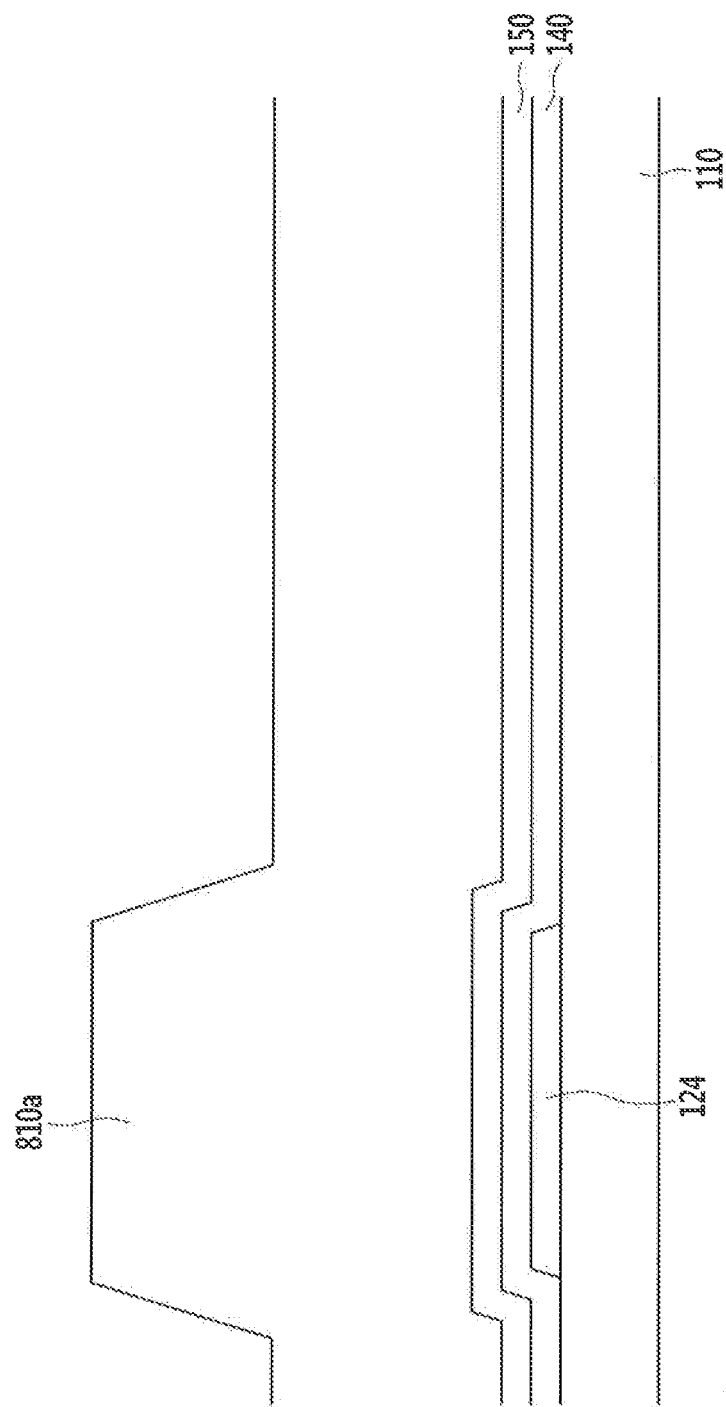
FIGS. 46, 50, and 54 are cross-sectional views of FIG. 40 taken along line IV'-IV''' according to an exemplary embodiment of the present invention.
Figure 47:
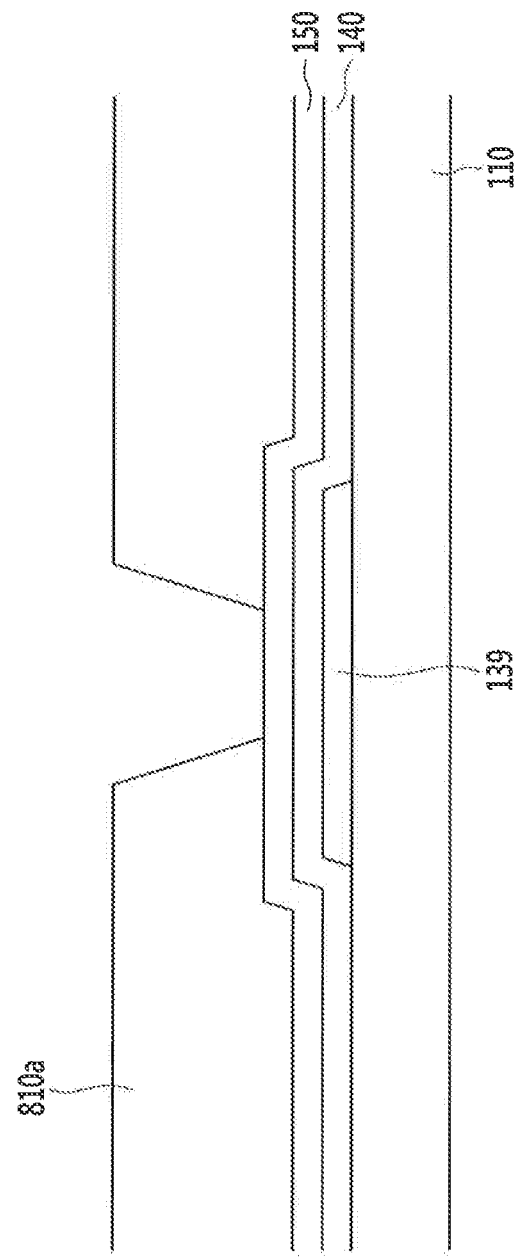
FIGS. 47, 51, and 55 are cross-sectional views of FIG. 40 taken along line V'-V''' according to an exemplary embodiment of the present invention.
Figure 48:
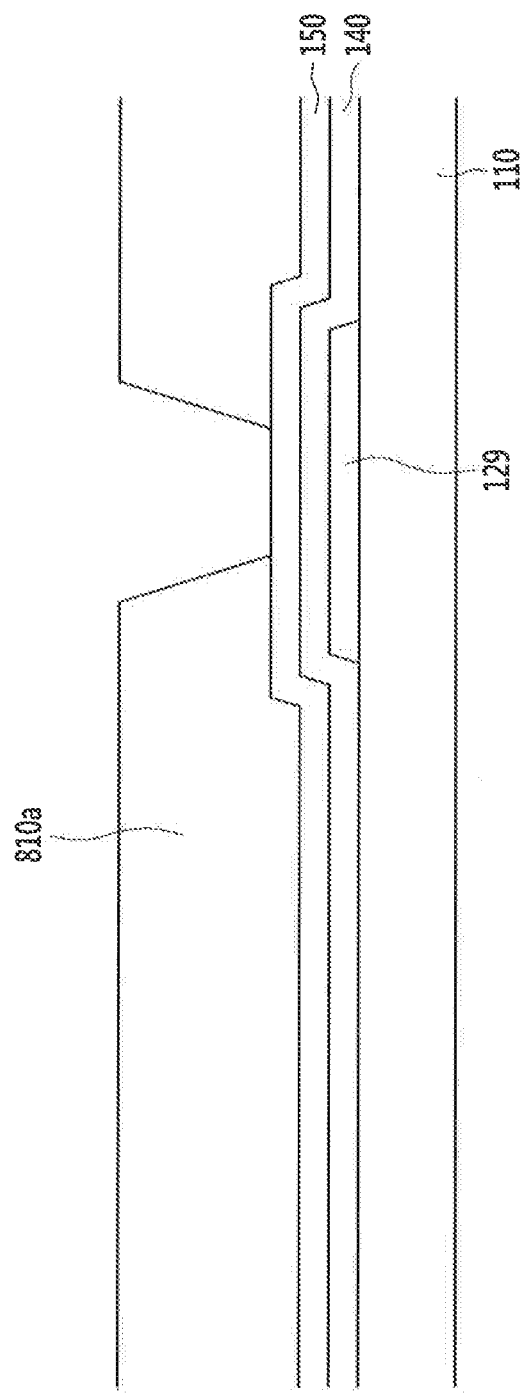
FIGS. 48, 52, and 56 are cross-sectional views of FIG. 40 taken along line VI'-VI''' according to an exemplary embodiment of the present invention.
Figure 49:
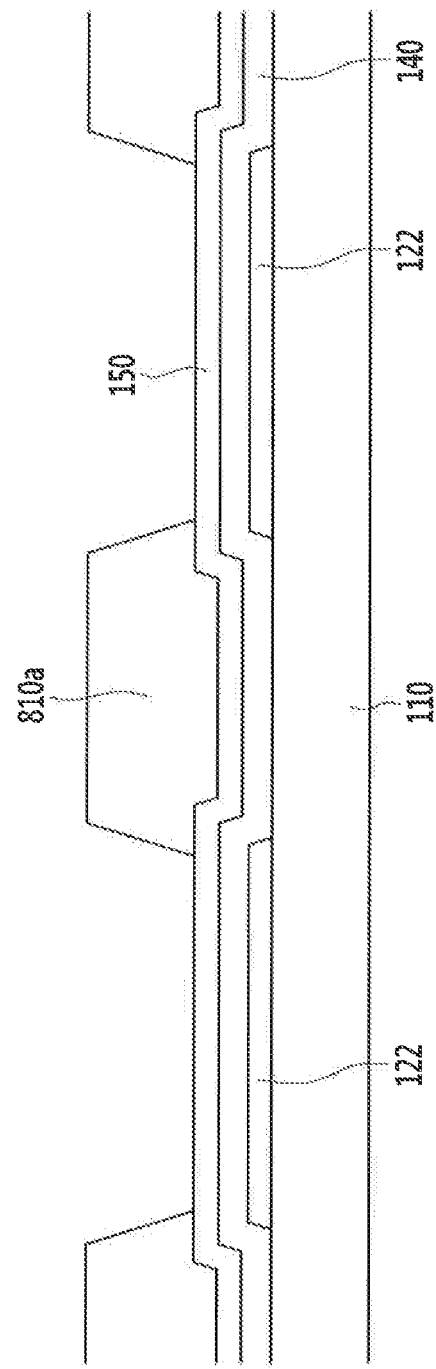
FIGS. 49, 53, and 57 are cross-sectional views of FIG. 40 taken along line VII'-VII''' according to an exemplary embodiment of the present invention.
Figure 50:
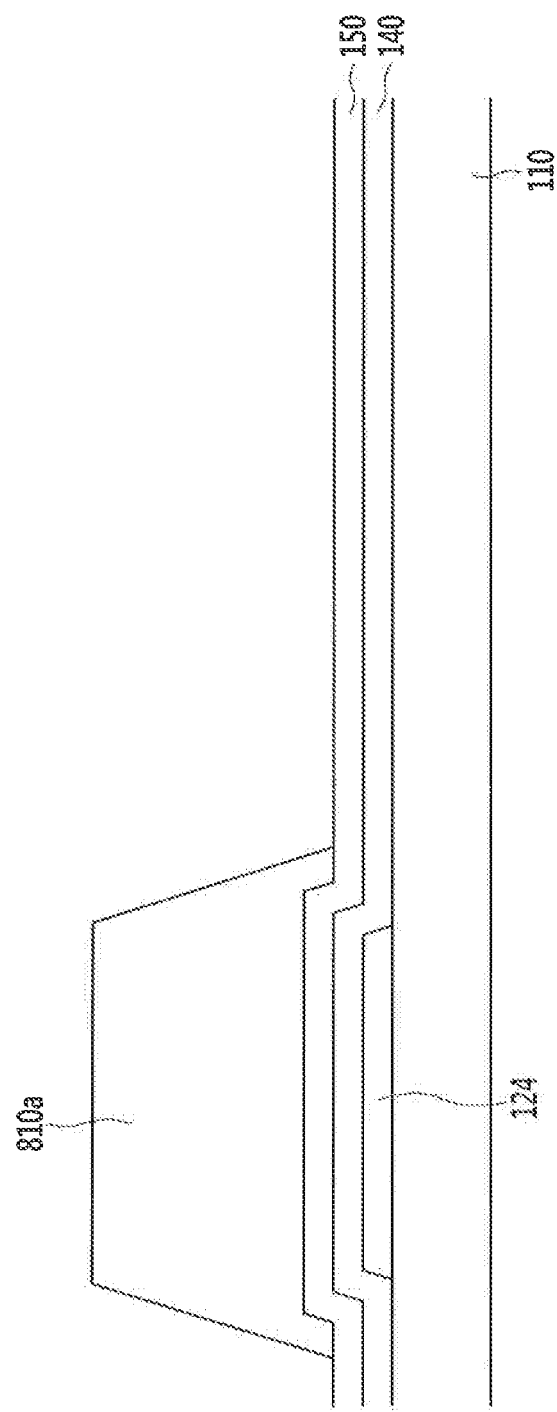
Figure 51:
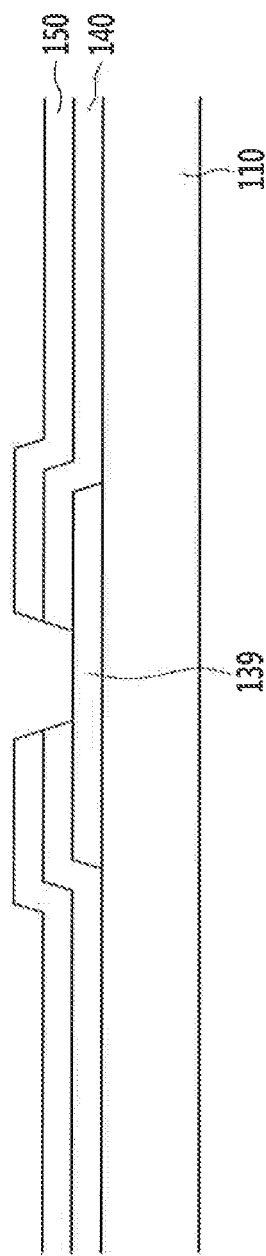
Figure 52:
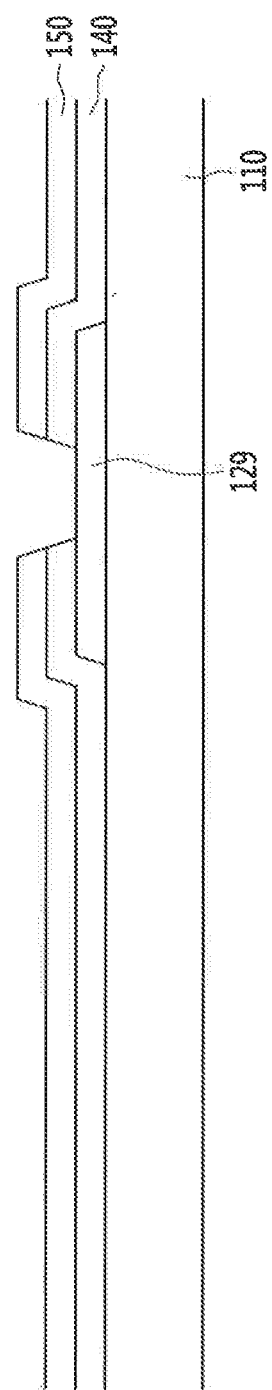
Figure 53:
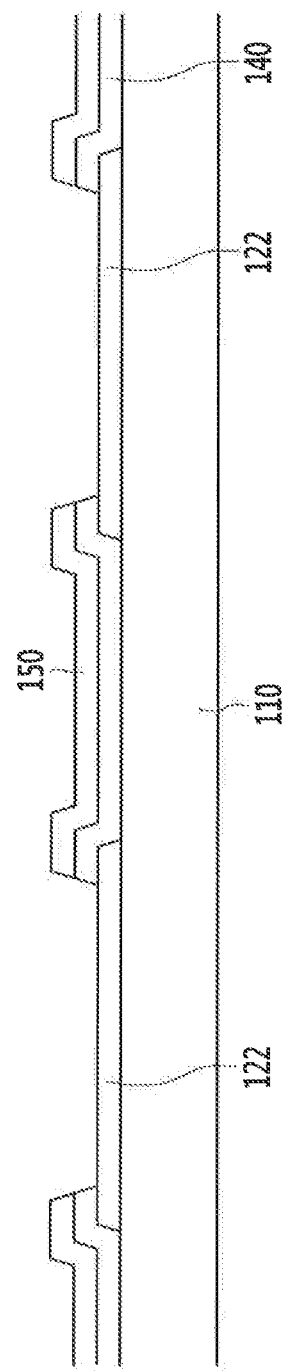
Figure 54:
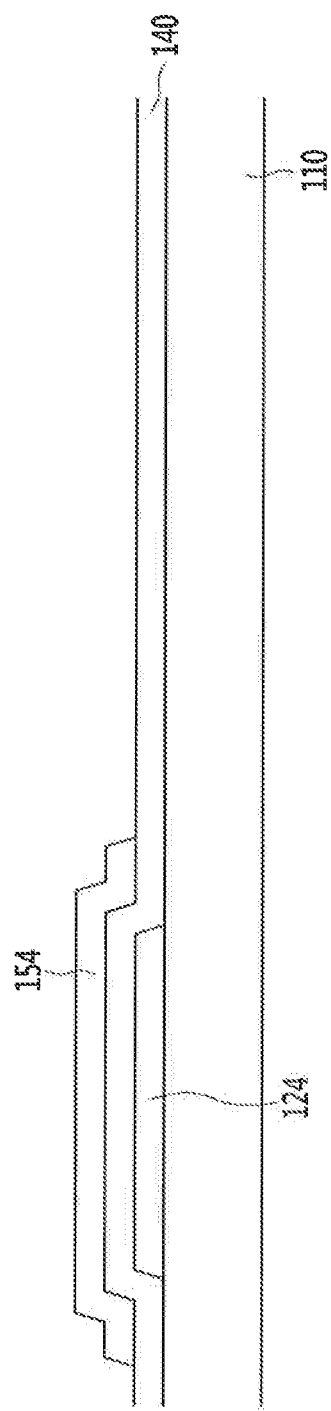
Figure 55:
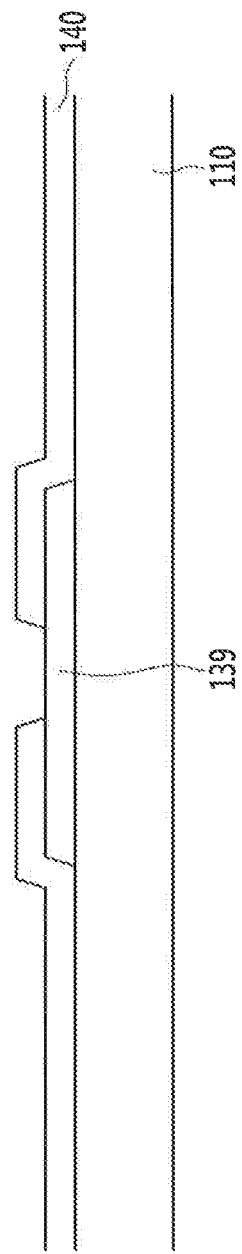
Figure 56:
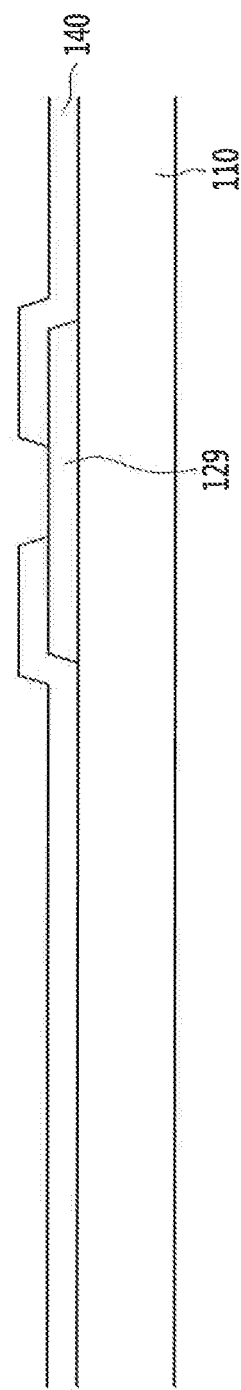
Figure 57:
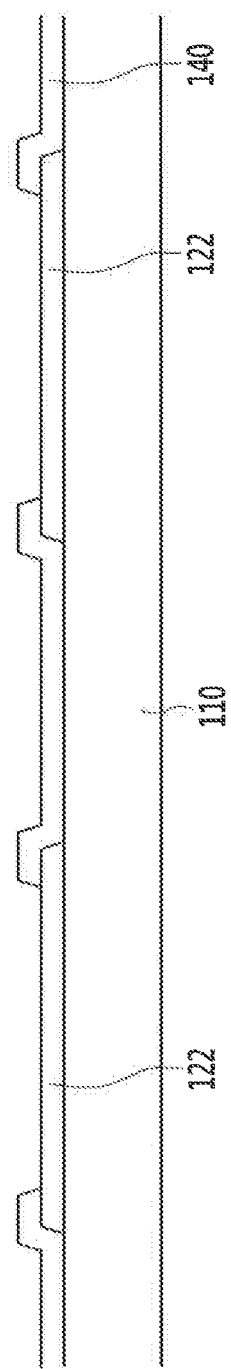

FIGS. 46, 50, and 54 are cross-sectional views of FIG. 40 taken along line IV'-IV" according to an exemplary embodiment, FIGS. 47, 51, and 55 are cross-sectional views of FIG. 40 taken along line V'-V" according to an exemplary embodiment, FIGS. 48, 52, and 56 are cross-sectional views of FIG. 40 taken along line VI'-VI" according to an exemplary embodiment, and FIGS. 49, 53, and 57 are cross-sectional views of FIG. 40 taken along line VII'-VII" according to an exemplary embodiment.

First, referring to FIGS. 46 to 49, gate conductors 121, 124, and 129 including a gate line 121, a gate electrode 124, and a gate pad portion 129 and a storage electrode pad portion 139 including a gate layer signal line 122 and a storage electrode line 131 are formed on an insulation substrate 110. A gate insulating layer 140 and an amorphous silicon layer 150 are formed thereon.

Next, a photosensitive pattern 800 having various thicknesses is formed on the amorphous silicon layer 150. For example, the photosensitive pattern 800 is formed to have a first thickness in a region where a semiconductor layer 154 is to be formed, and to have a second thickness of, for example, half the first thickness in regions other than a region where a contact hole is to be formed.

The formation of the pattern 800 may be formed, is not limited to, by using a halftone mask.

Next, referring to FIGS. 50 to 53, when etching is performed using the photosensitive pattern 800 as a mask, only the photosensitive pattern 800 having the second thickness remains and the photosensitive pattern 800 having the second thickness is completely removed in a region where the photosensitive pattern 800 having the first thickness is positioned, and the amorphous silicon layer 150 and the gate insulating layer 140 are etched to form an opening in a region where the photosensitive pattern 800 is not positioned.

Next, as shown in FIGS. 54 to 57, when the amorphous silicon layer 150 is etched using the remaining photosensitive pattern 800 as a mask, all of the amorphous silicon layer 150, except for one part positioned in a forming region of the semiconductor layer 154 where the photosensitive pattern 800 having the second thickness is positioned, is completely etched, and the semiconductor layer 154 positioned on the gate electrode 124 is formed.

Next, forming the thin film transistor array panel by laminating and then etching an ohmic contact layer 160 and a data conductive layer 170 is the same as that of the previous embodiment of the present invention.

The manufacturing method of this embodiment is substantially similar to that of the previous embodiment, except that one mask is used when the semiconductor layer 154 and the data conductor 171 are formed. In the previous embodiment, two masks are used to form the semiconductor layer and the data line.

Connecting portions 166 and 176 positioned in the region where the second contact hole 185b is positioned are further included. The gate pad portion 129 and the data layer signal line 172 are directly coupled to each other through the third contact hole 185c. The gate layer signal line 122 is overlapped with the data pad portion 179 in the contact hole 185e. For example, the ohmic contact 169 is interposed between the gate layer signal line 122 and the data pad portion 179. Alternatively, the gate layer signal line 122 may be in contact with the data pad portion 179. In this case, the ohmic contact 169 may be omitted. The ohmic contact 166 may be referred to as the connecting portion 166.

According to the aforementioned manufacturing method of the thin film transistor array panel, the second passivation layer, the organic layer, the common electrode, and the first passivation layer may be formed using one mask.

That is, the thin film transistor array panel can be manufactured using a small number of masks, thereby having an advantage of reducing the manufacturing cost and the manufacturing time.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a substrate;
a thin film transistor positioned on the substrate;
a first passivation layer positioned on the thin film transistor;
a common electrode positioned on the first passivation layer;
a second passivation layer positioned on the common electrode;
a pixel electrode positioned on the second passivation layer and coupled to the thin film transistor through a first contact hole; and a first contact assistant positioned on the second passivation layer and coupled to a storage electrode pad portion and the common electrode through a second contact hole, wherein the first contact hole penetrates the first passivation layer, the common electrode, and the second passivation layer, wherein a first part of the first contact hole formed in the common electrode is larger than a second part of the first contact hole formed in the second passivation layer, wherein the second contact hole penetrates the first passivation layer, the common electrode, and the second passivation layer, wherein a horizontal contact hole width between edges of the common electrode for a second part of the second contact hole formed in the common electrode is smaller than a horizontal contact hole width between edges of the second passivation layer for a third part of the second contact hole formed in the second passivation layer, wherein a horizontal contact hole width between vertical bottom edges of the common electrode for the second part of the second contact hole formed in the common electrode is larger than a horizontal contact hole width between vertical top edges of the first passivation layer for a first part of the second contact hole formed in the first passivation layer, and wherein the second passivation layer does not contact the common electrode in the first part of the first contact hole.

2. The thin film transistor array panel of claim 1, further comprising an empty space disposed between the common electrode and the pixel electrode.

3. The thin film transistor array panel of claim 1, wherein the pixel electrode has a thickness of more than about 500 Å.

4. The thin film transistor array panel of claim 1, further comprising an organic layer interposed between the first passivation layer and the second passivation layer.

5. The thin film transistor array panel of claim 1, comprising the storage electrode pad portion disposed outside a pixel area, wherein a storage electrode line is extended from the storage electrode pad portion into the pixel area, wherein a common voltage is applied to the storage electrode pad portion.

6. The thin film transistor array panel of claim 1, further comprising a gate driver, wherein the gate driver includes a data layer signal line that is electrically coupled to a gate pad portion of a pixel area using a second contact assistant, wherein the second contact assistant is connected to the data layer signal line and the gate pad portion through a third contact hole positioned in the gate driver and a fourth contact hole positioned in the pixel area, respectively.

7. The thin film transistor array panel of claim 1, further comprising a gate driver including a data layer signal line, wherein the data layer signal line is extended from the gate driver to a third contact hole positioned in a pixel area, wherein the data layer signal line is connected to a gate pad portion through the third contact hole.

8. The thin film transistor array panel of claim 7, comprising the storage electrode pad portion disposed in the pixel area, wherein the storage electrode pad portion is connected to the common electrode through the second contact hole disposed in the pixel area.

* * * * *